US008957580B2

(12) United States Patent
Reiherzer

(10) Patent No.: US 8,957,580 B2
(45) Date of Patent: Feb. 17, 2015

(54) LIGHTING DEVICE INCLUDING MULTIPLE WAVELENGTH CONVERSION MATERIAL LAYERS

(75) Inventor: Jesse Reiherzer, Wake Forest, NC (US)

(73) Assignee: Cree, Inc., Durham, NC (US)

( * ) Notice: Subject to any disclaimer, the term of this patent is extended or adjusted under 35 U.S.C. 154(b) by 276 days.

(21) Appl. No.: 13/372,063

(22) Filed: Feb. 13, 2012

(65) Prior Publication Data

US 2013/0208442 A1 Aug. 15, 2013

(51) Int. Cl.
*H01J 1/62* (2006.01)
*H01J 63/04* (2006.01)

(52) U.S. Cl.
USPC ............................. 313/506; 313/498; 313/512

(58) Field of Classification Search
CPC . H01L 25/0753; H01L 33/507; H01L 33/502; H01L 33/20; H01L 33/22; H01L 33/505; H01L 33/54; H05B 33/00; H05B 33/14
USPC ................................................. 313/498–512
See application file for complete search history.

(56) References Cited

U.S. PATENT DOCUMENTS

| | | | |
|---|---|---|---|
| 3,875,456 A * | 4/1975 | Kano et al. ..................... | 313/501 |
| 5,959,316 A | 9/1999 | Lowery | |
| 6,252,254 B1 * | 6/2001 | Soules et al. ..................... | 257/89 |
| 6,350,041 B1 | 2/2002 | Tarsa et al. | |
| 6,576,930 B2 | 6/2003 | Reeh et al. | |
| 6,936,857 B2 * | 8/2005 | Doxsee et al. .................. | 257/89 |
| 7,005,679 B2 * | 2/2006 | Tarsa et al. ..................... | 257/89 |
| 7,183,577 B2 | 2/2007 | Mueller-Mach et al. | |
| 7,250,715 B2 * | 7/2007 | Mueller et al. ................. | 313/485 |
| 7,598,669 B2 | 10/2009 | Toguchi et al. | |
| 7,709,853 B2 | 5/2010 | Medendorp, Jr. | |
| 2005/0045898 A1 | 3/2005 | Leu et al. | |
| 2006/0226759 A1 | 10/2006 | Masuda et al. | |
| 2007/0012940 A1 | 1/2007 | Suh et al. | |
| 2007/0223219 A1 | 9/2007 | Medendorp et al. | |
| 2008/0080165 A1 | 4/2008 | Kim et al. | |
| 2008/0308825 A1 | 12/2008 | Chakraborty et al. | |
| 2009/0039375 A1 | 2/2009 | LeToquin et al. | |

(Continued)

FOREIGN PATENT DOCUMENTS

| | | |
|---|---|---|
| JP | 2001-291406 A | 10/2001 |
| JP | 2005-244226 A | 9/2005 |

(Continued)

OTHER PUBLICATIONS

Ming Ma, et al., Effects of the refractive index of the encapsulant on the light-extraction efficiency of light-emitting diodes, Optics Express, Sep. 12, 2011, pp. A1135-A1140, vol. 19, No. S5.

(Continued)

*Primary Examiner* — Anh Mai
*Assistant Examiner* — Kevin Quarterman
(74) *Attorney, Agent, or Firm* — Withrow & Terranova, P.L.L.C.; Vincent K. Gustafson

(57) ABSTRACT

A lighting device includes an electrically activated emitter, a first layer that contains a first lumiphoric material, and a second layer that contains a second lumiphoric material, with a textured interface between the first layer and the second layer. Additional lumiphoric material layers, spacer layers, and/or encapsulant layers may be provided. Multiple textured interfaces may be provided. Textured interfaces may be arranged as lenses, including Fresnel lenses.

47 Claims, 11 Drawing Sheets

(56) References Cited

U.S. PATENT DOCUMENTS

| | | |
|---|---|---|
| 2009/0250714 A1 | 10/2009 | Yun et al. |
| 2009/0295265 A1 | 12/2009 | Tabuchi et al. |
| 2012/0161621 A1 | 6/2012 | Sato |
| 2013/0168719 A1 | 7/2013 | Watkins et al. |

FOREIGN PATENT DOCUMENTS

| | | |
|---|---|---|
| JP | 2006-245443 A | 9/2006 |
| JP | 2010103404 A | 5/2010 |
| WO | WO-2009107052 A1 | 9/2009 |
| WO | WO-2011109097 A1 | 9/2011 |

OTHER PUBLICATIONS

U.S. Appl. No. 13/372,076, filed Feb. 13, 2012.

Non-Final Office Action for U.S. Appl. No. 13/372,076, mailed Aug. 8, 2013, 14 pages.

Non-Final Office Action for U.S. Appl. No. 13/372,076, mailed Mar. 18, 2014, 10 pages.

Notice of Allowance for U.S. Appl. No. 13/372,076, mailed Oct. 7, 2014, 12 pages.

* cited by examiner

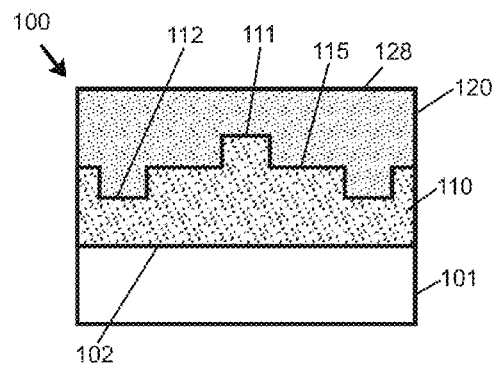
FIG._1
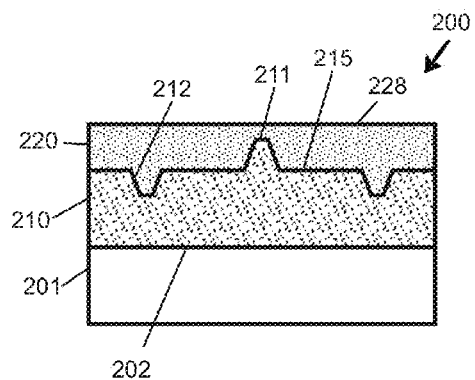
FIG._2
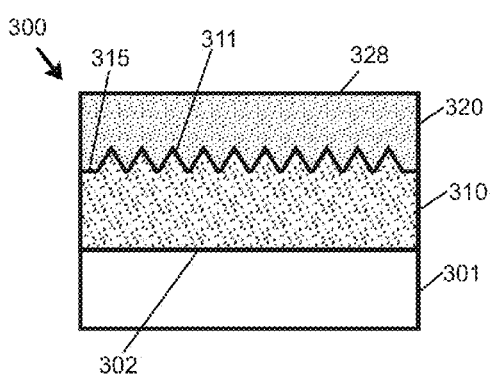
FIG._3
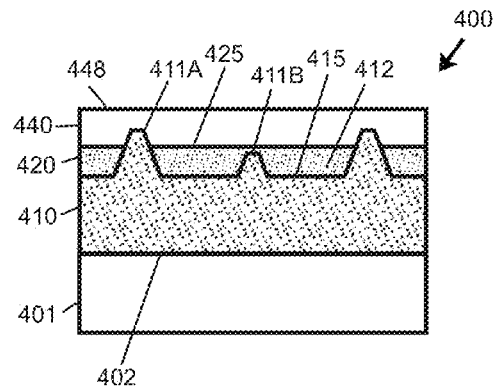
FIG._4
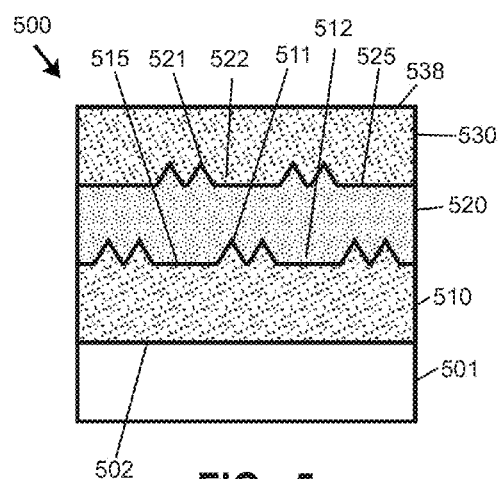
FIG._5
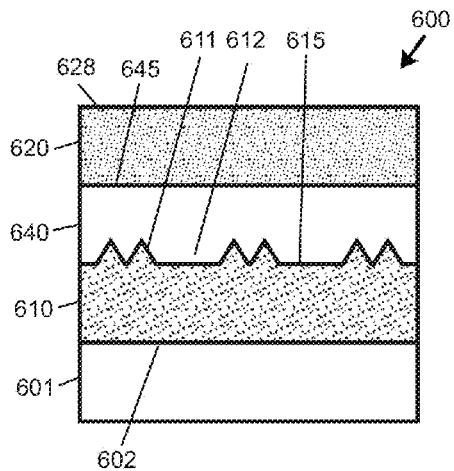
FIG._6

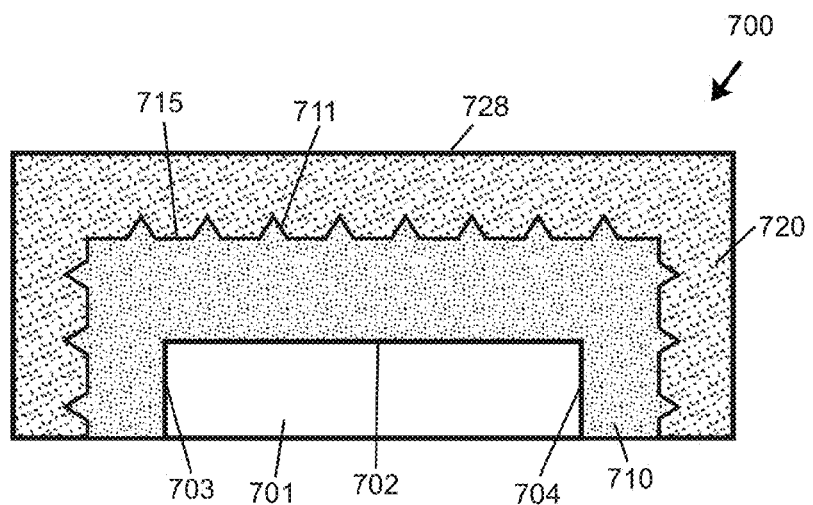
FIG._7
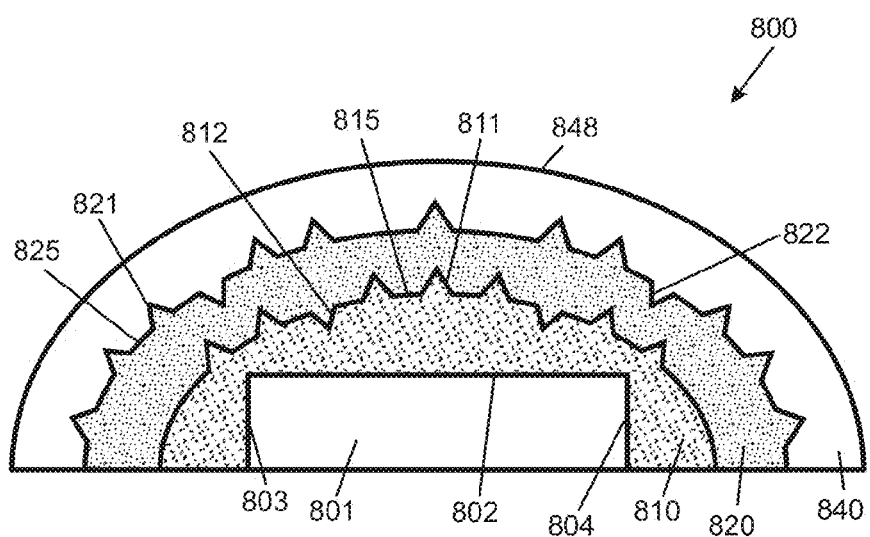
FIG._8

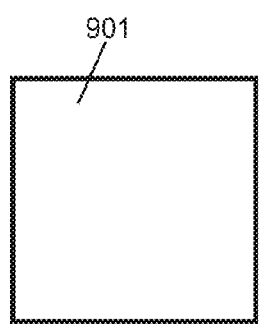
FIG._9A
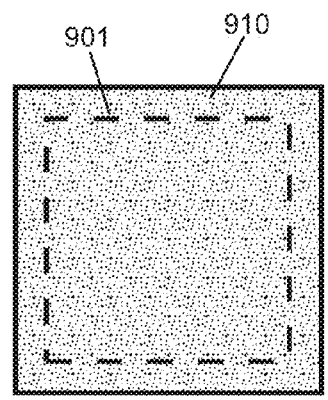
FIG._9B
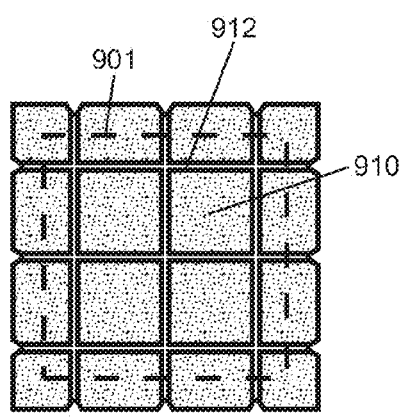
FIG._9C
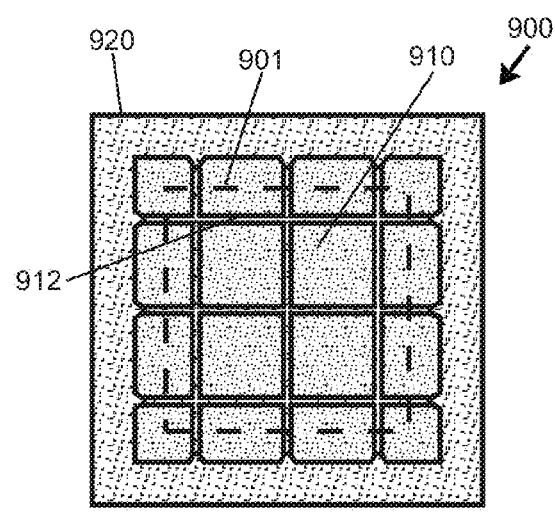
FIG._9D
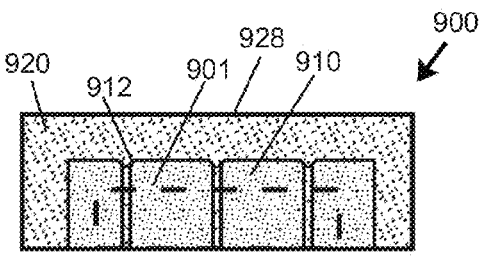
FIG._9E

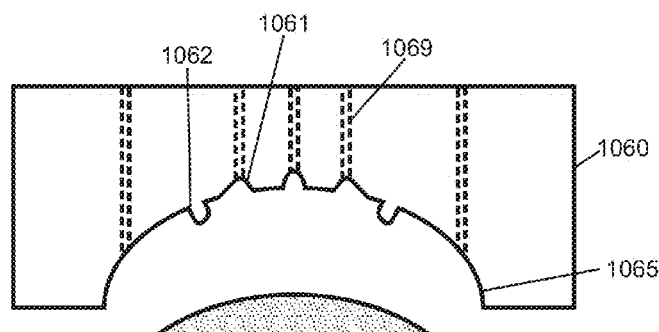
FIG._10A
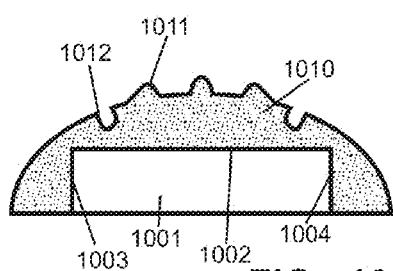
FIG._10B
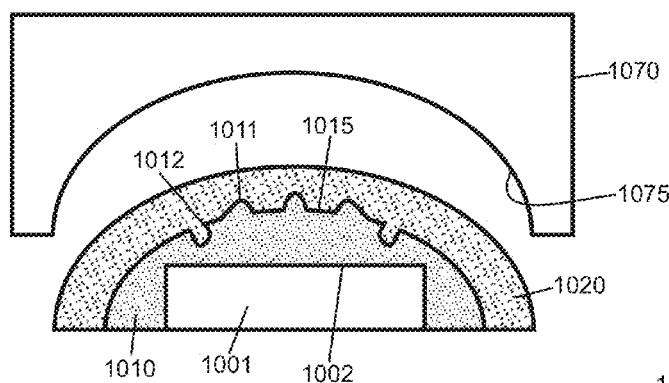
FIG._10C
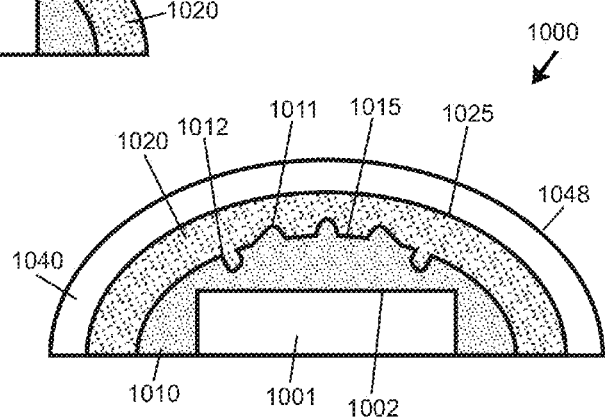
FIG._10D

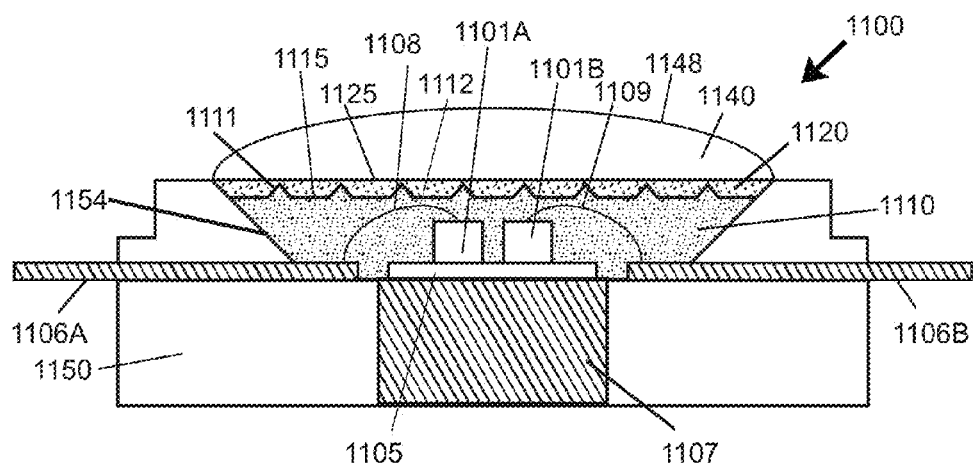
FIG._11
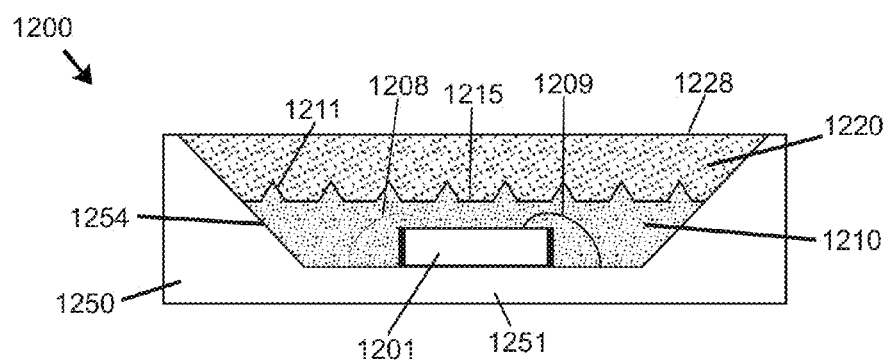
FIG._12
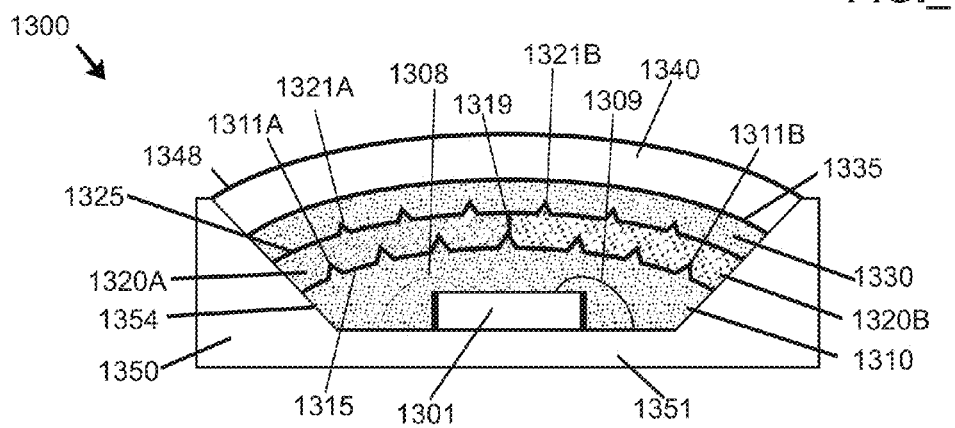
FIG._13

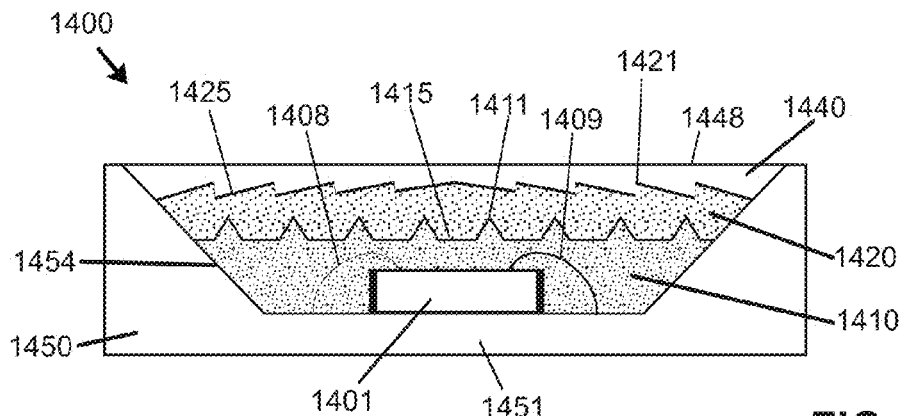
FIG._14
FIG._15
FIG._16

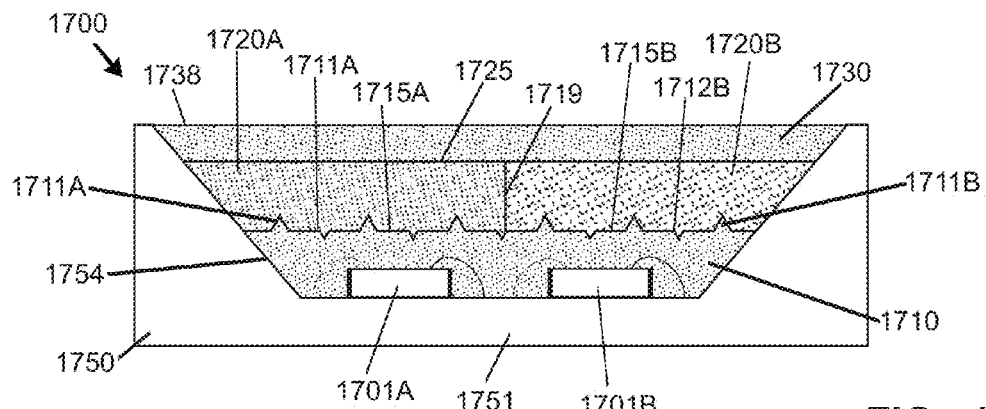
FIG._17
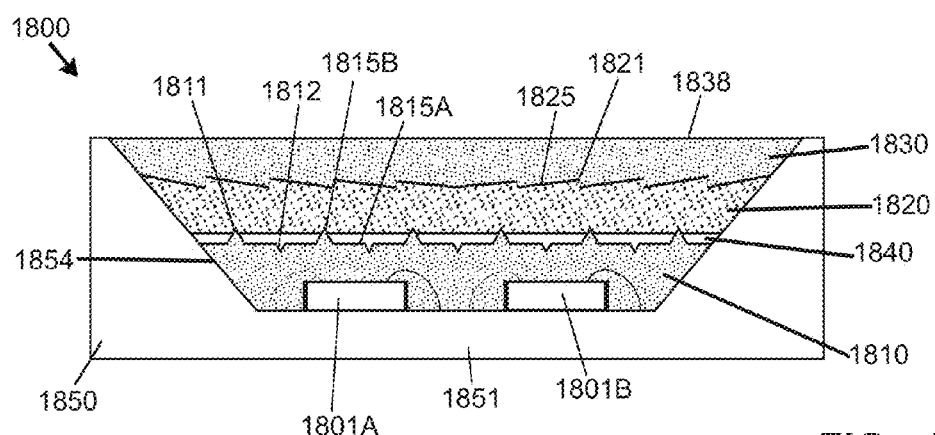
FIG._18
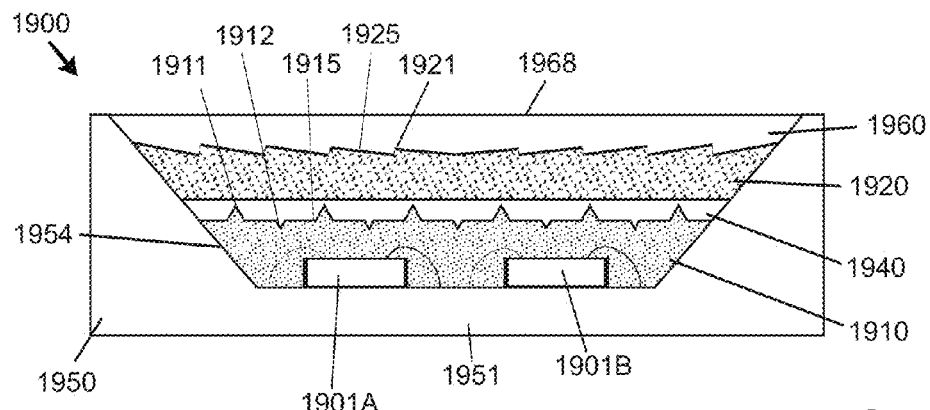
FIG._19

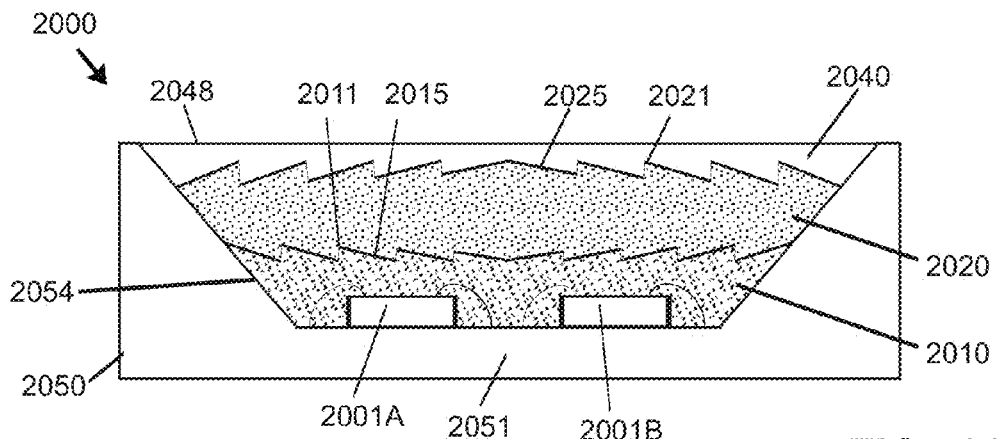
FIG._20
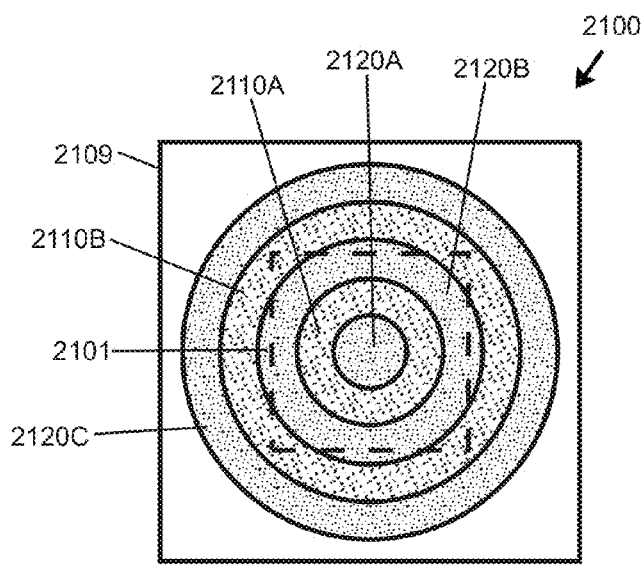
FIG._21

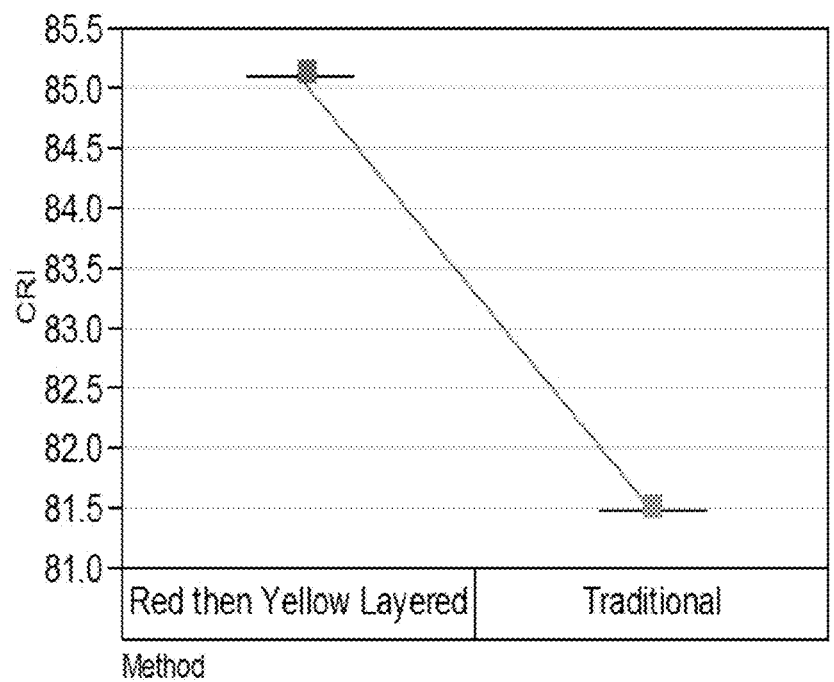
FIG._24A
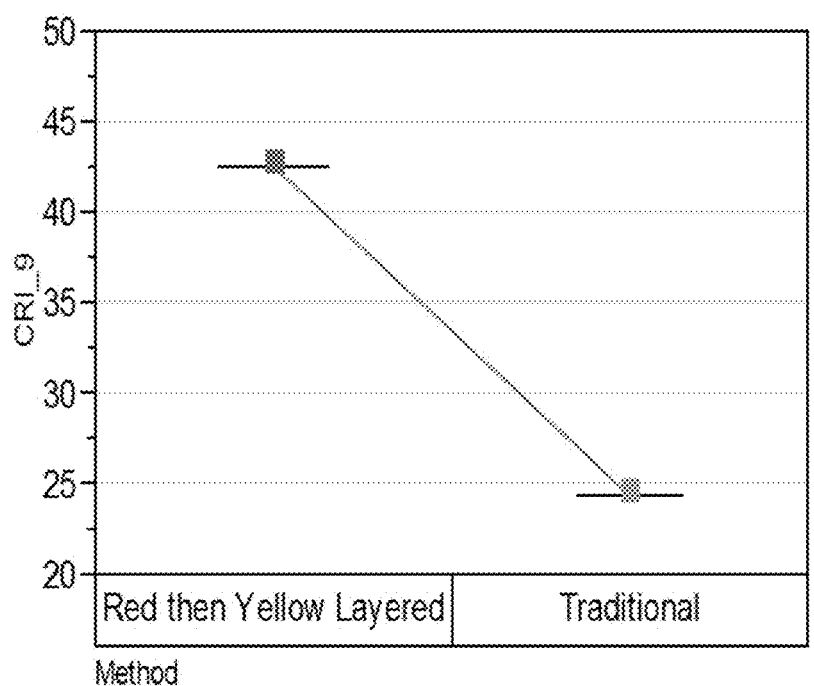
FIG._24B

LIGHTING DEVICE INCLUDING MULTIPLE WAVELENGTH CONVERSION MATERIAL LAYERS

TECHNICAL FIELD

Subject matter herein relates to solid state lighting devices, including devices with multiple layers of wavelength conversion materials stimulated by at least one solid state light emitter, and methods of making and using same.

BACKGROUND

Solid state light sources may be utilized to provide colored (e.g., non-white) or white light (e.g., perceived as being white or near-white). A solid state lighting device may include, for example, at least one organic or inorganic light emitting diode ("LED") or a laser. White solid state emitters have been investigated as potential replacements for white incandescent or fluorescent lamps due to reasons including substantially increased efficiency and longevity. Longevity of solid state emitters is of particular benefit in environments where access is difficult and/or where change-out costs are extremely high.

Because light that is perceived as white is necessarily a blend of light of two or more colors (or wavelengths), and light emitting diodes are inherently narrow-band emitters, no single light emitting diode junction has been developed that can produce white light. A representative example of a white LED lamp includes a blue LED chip (e.g., made of InGaN and/or GaN), arranged to stimulate a phosphor one or more phosphors (e.g., commonly yellow phosphors such as YAG:Ce or BOSE). A portion of the emissions of the blue LED chip pass through the phosphor, while another portion of such emissions is absorbed by the phosphor, which becomes excited and emits yellow emissions. The resulting mixture of blue and yellow light (sometimes termed 'blue shifted yellow' or 'BSY' light) may be perceived as cool white light. Various methods exist to enhance cool white light to increase its warmth, including supplementation with a red LEDs or red phosphor. Additional or different supplemental LEDs and/or phosphors (e.g., of other colors) may be used.

Various methods exist for arranging lumiphoric materials (e.g., phosphors) to be stimulated by solid state emitters. According to one method, one or more lumiphoric materials are coated directly on a surface of a solid state emitter chip, which may be incorporated into a lighting device. A solid state emitter chip LED can be coated and fabricated using many different methods, with one suitable method being described in U.S. Patent Application Publication No. 2008/0173884 to Chitnis et al. entitled "Wafer Level Phosphor Coating Method and Devices Fabricated Utilizing Method. Alternatively a LED may be coated using other methods such as electrophoretic deposition, with a suitable method disclosed in U.S. Patent Application Publication No. 2007/0158668 to Tarsa et al. The foregoing published applications are commonly assigned to the owner of the present application and are hereby incorporated by reference as if set forth fully herein. According to another method, a solid state emitter chip may be mounted to a mounting element (e.g., a flat substrate, a recessed surface bounded by a reflector, or other configuration) and one or more lumiphoric materials may be combined with a binder (e.g., epoxy or silicone) and deposited in one or more layers over the previously-mounted solid state emitter chip. In yet another method, one or more lumiphoric materials may be associated with an optical element such as a lens that is positioned on or over a solid state emitter chip.

Various solid state lighting devices including multiple discrete layers or regions of lumiphoric materials are disclosed in U.S. Patent Application Publication No. 2009/0039375 A1 to LeToquin, et al. and U.S. Pat. No. 7,709,853 to Medendorp, Jr., which are commonly assigned to the owner of the present application and are hereby incorporated by reference as if set forth fully herein.

Although lighting devices including multiple discrete lumiphoric material layers or regions according to certain configurations are known, various improvements to the foregoing configurations would be desirable. It would be desirable to enhance adhesion between such layers or regions. It would also be desirable to facilitate greater control of optical properties (including, but not limited, focus and/or directionality) of lighting devices including lumiphoric materials. It would further be desirable to enhance color mixing of, and/or increase light extraction from, lighting device including lumiphoric materials. Various embodiments as disclosed herein address or more of the foregoing concerns.

SUMMARY

The present invention relates in various aspects to lighting devices including a first layer that includes a first lumiphoric material and a second layer that includes a second lumiphoric material, and including a textured interface between the first layer and the second layer.

In one aspect, the invention relates to a lighting device comprising: at least one electrically activated emitter; a first layer comprising at least one first lumiphoric material overlying at least a portion of the at least one electrically activated emitter and arranged to be stimulated by emissions of the at least one electrically activated emitter; and a second layer comprising at least one second lumiphoric material overlying at least a portion of the first layer and arranged to be stimulated by emissions of the at least one electrically activated emitter; wherein an interface between the first layer and the second layer comprises at least one of the following features (i) and (ii): (i) at least one outwardly protruding portion of the first layer that includes at least one protruding portion lateral wall of the first layer arranged in contact with the second layer, wherein the at least one protruding portion of the first layer comprises a height of at least 5 micrometers; and (ii) at least one recess defined in the first layer that is bounded by at least one recess lateral wall of the first layer arranged in contact with the second layer, wherein the at least one recess defined in the first layer comprises a depth of at least 5 micrometers.

In another aspect, the invention relates to a lighting device comprising: at least one solid state emitter; a first layer comprising at least one first lumiphoric material arranged to receive light generated by at least one solid state emitter; a second layer comprising at least one second lumiphoric material overlying the first layer and arranged to receive emissions from the first layer; an additional layer overlying the second layer and arranged to receive emissions from the second layer; wherein at least one surface of at least one of the first layer and the second layer comprises at least one of the following items (i) to (iv): (i) at least one outwardly protruding portion comprising a height of at least 5 micrometers; (ii) at least one recess comprising a depth of at least 5 micrometers; (iii) at least three features that are regularly spaced relative to one another with substantially equal gaps between adjacent features, wherein the at least three features that are regularly spaced include at least one of recesses and outwardly protruding portions; and (iv) at least three features comprising regularized height or depth that include at least one of recesses and outwardly protruding portions, including variation in height or depth of less than 20% among the at least three features comprising regularized height or depth.

In another aspect, the invention relates to a method for fabricating at least one lighting device, the method comprising: depositing a first layer comprising at least one first lumiphoric material over at least a portion of at least one electrically activated emitter, with the at least one first lumiphoric material arranged to be stimulated by emissions of the at least one electrically activated emitter; forming at least one of the following items (i) to (iv) in or on the first layer: (i) at least one outwardly protruding portion of the first layer that includes at least one protruding portion lateral wall of the first layer, wherein the at least one protruding portion of the first layer comprises a height of at least 5 micrometers; (ii) at least one recess defined in the first layer that is bounded by at least one recess lateral wall of the first layer arranged in contact with the second layer, wherein the at least one recess defined in the first layer comprises a depth of at least 5 micrometers; and depositing a second layer comprising at least one second lumiphoric material over at least a portion of the first layer and arranged to be stimulated by emissions of the at least one electrically activated emitter; (iii) at least three features that are regularly spaced relative to one another with substantially equal gaps between adjacent features, wherein the at least three features that are regularly spaced include at least one of recesses and outwardly protruding portions; and (iv) at least three features comprising regularized height or depth that include at least one of recesses and outwardly protruding portions, including variation in height or depth of less than 20% among the at least three features comprising regularized height or depth.

Further aspects relating to methods of illuminating an object, a space, or an environment utilizing at least one lighting device as disclosed herein.

In another aspect, any of the foregoing aspects, and/or various separate aspects and features as described herein, may be combined for additional advantage.

Other aspects, features and embodiments of the invention will be more fully apparent from the ensuing disclosure and appended claims.

BRIEF DESCRIPTION OF THE DRAWINGS

FIG. 1 is a side cross-sectional schematic view of a lighting device according to one embodiment including an electrically activated emitter overlaid with a first layer containing at least one first lumiphoric material and a second layer containing at least one second lumiphoric material, with a textured interface between the first layer and the second layer.

FIG. 2 is a side cross-sectional schematic view of a lighting device according to one embodiment including an electrically activated emitter overlaid with a first layer containing at least one first lumiphoric material and a second layer containing at least one second lumiphoric material, with a textured interface between the first layer and the second layer.

FIG. 3 is a side cross-sectional schematic view of a lighting device according to one embodiment including an electrically activated emitter overlaid with a first layer containing at least one first lumiphoric material and a second layer containing at least one second lumiphoric material, with a textured interface between the first layer and the second layer.

FIG. 4 is a side cross-sectional schematic view of a lighting device according to one embodiment including an electrically activated emitter overlaid with a first layer containing at least one first lumiphoric material, a second layer containing at least one second lumiphoric material, and an encapsulant layer, with a textured interface between the first layer and the second layer, wherein the textured interface includes protruding portions of the first layer of different heights including protrusions extending from the first layer through the second layer into the third layer.

FIG. 5 is a side cross-sectional schematic view of a lighting device according to one embodiment including an electrically activated emitter overlaid with a first layer containing at least one first lumiphoric material, a second layer containing at least one second lumiphoric material, and a third layer containing at least one third lumiphoric material, with a textured interface between the first layer and the second layer, and another textured interface between the second layer and the third layer.

FIG. 6 is a side cross-sectional schematic view of a lighting device according to one embodiment including an electrically activated emitter overlaid with a first layer containing at least one first lumiphoric material, a spacer layer, and a second layer containing at least one second lumiphoric material, with a textured interface between the first layer and the spacer layer.

FIG. 7 is a side cross-sectional schematic view of a lighting device according to one embodiment including an electrically activated emitter overlaid with a first layer containing at least one first lumiphoric material extending over a top surface and side walls of the emitter, and a second layer containing at least one second lumiphoric material extending over a top surface and side walls of the first layer, including textured surfaces between the first layer and the second layer.

FIG. 8 is a side cross-sectional schematic view of a lighting device according to one embodiment including an electrically activated emitter overlaid with a hemispherical first layer containing at least one first lumiphoric material extending over a top surface and side walls of the emitter, a hemispherical second layer containing at least one second lumiphoric material extending over the first layer, and a hemispherical encapsulant extending over the second layer, including a textured surface between the first layer and the second layer, and including another textured surface between the second layer and the encapsulant layer.

FIGS. 9A-9E illustrate various stages of a method for producing a lighting device according to one embodiment, wherein: FIG. 9A is a top schematic view of an electrically activated emitter; FIG. 9B is a top plan schematic view of the emitter of FIG. 9A overlaid with a first layer containing at least one first lumiphoric material; FIG. 9C is a top plan schematic view of the emitter and first layer of FIG. 9B after formation of features (e.g., recesses) in top and side surfaces of the first layer; FIG. 9D is a top plan schematic view of the emitter and first layer of FIG. 9C further overlaid with a second layer containing at least one second lumiphoric material; and FIG. 9E is a side cross-sectional schematic view of the device of FIG. 9D.

FIGS. 10A-10D illustrate various stages of a method for producing a lighting device according to one embodiment, wherein: FIG. 10A is a side cross-sectional schematic view of an electrically activated electrically activated emitter overlaid with a first layer containing at least one lumiphoric material, positioned under a compression die having protrusions and recesses defined therein to define corresponding recesses and protrusions in the first layer following contact thereof; FIG. 10B is a side cross-sectional schematic view of the electrically activated electrically activated emitter and first layer of FIG. 10A following formation of protrusions and recesses in the first layer;

FIG. 10C is a side cross-sectional schematic view of the emitter and first layer of FIG. 10B overlaid with a second layer, following removal of a hemispherical die used to shape the second layer; and FIG. 10D is a side cross-sectional schematic view of the emitter, first layer, and second layer of FIG. 10C following formation of an encapsulant layer over the second layer.

FIG. 11 is a side cross-sectional schematic view of a leadframe-based electrically activated emitter package including first and second electrically activated emitters arranged within a reflector cup and overlaid with a first layer containing at least one first lumiphoric material, a second layer containing at least one second lumiphoric material, and a hemispherical encapsulant and/or lens, wherein a textured interface is provided between the first layer and the second layer.

FIG. 12 is a side cross-sectional schematic view of a lighting device including an electrically activated emitter arranged within a reflector cup and overlaid with a first layer containing at least one first lumiphoric material and a second layer containing at least one second lumiphoric material with a substantially flat upper surface, with a textured interface between the first layer and the second layer.

FIG. 13 is a side cross-sectional schematic view of a lighting device including an electrically activated emitter arranged within a reflector cup and overlaid with a first layer containing at least one first lumiphoric material, a second layer containing at least one second lumiphoric material (including one portion containing a lumiphoric material and another portion containing at least one other lumiphoric material), a third layer containing at least one third lumiphoric material, and an encapsulant and/or lens provided over the third layer, with a textured interface between the first layer and the second layer, and another textured interface between the second layer and the third layer.

FIG. 14 is a side cross-sectional schematic view of a lighting device including an electrically activated emitter arranged within a reflector cup and overlaid with a first layer containing at least one first lumiphoric material, a second layer containing at least one second lumiphoric material, and an encapsulant, with a textured interface between the first layer and the second layer, and another textured interface between the second layer and the third layer.

FIG. 15 is a side cross-sectional schematic view of a lighting device including an electrically activated emitter arranged within a reflector cup, wherein the emitter overlaid with a spacer layer and spatially separated from a first layer containing at least one first lumiphoric material, a lower encapsulant layer, a second layer containing at least one second lumiphoric material, and an upper encapsulant layer, with a textured interface including protruding portions of the first layer extending through the lower encapsulant layer into contact with the second layer.

FIG. 16 is a side cross-sectional schematic view of a lighting device including an electrically activated emitter arranged within a reflector cup, wherein the emitter is spatially separated from a first layer, and the emitter is overlaid by the first layer containing at least one first lumiphoric material, a second layer containing at least one second lumiphoric material, and at least one third layer containing at least one third lumiphoric material, with a textured interface including protruding portions of the first layer extending through the second layer into contact with the third layer.

FIG. 17 is a side cross-sectional schematic view of a lighting device including a first and a second electrically activated emitter arranged within a reflector cup and overlaid with a first layer containing at least one first lumiphoric material, a second layer containing at least one second lumiphoric material (including one portion containing one lumiphoric material and another laterally adjacent portion containing at least one other lumiphoric material), a third layer containing at least one third lumiphoric material, and an encapsulant and/or lens provided over the third layer, with a textured interface between the first layer and the second layer.

FIG. 18 is a side cross-sectional schematic view of a lighting device including a first and a second electrically activated emitter arranged within a reflector cup and overlaid with a first layer containing at least one first lumiphoric material, a spacer layer, a second layer containing at least one second lumiphoric material, and a third layer containing at least one third lumiphoric material, with a textured interface between the first layer and the second layer including protruding portions of the first layer that extend through the spacer layer into the second layer, and with a textured interface between the second layer and the third layer including protruding portions of the second layer arranged as a converging Fresnel lens.

FIG. 19 is a side cross-sectional schematic view of a lighting device including a first and a second electrically activated emitter arranged within a reflector cup and overlaid with a first layer containing at least one first lumiphoric material, a spacer layer, a second layer containing at least one second lumiphoric material, and an encapsulant layer, with a textured interface between the first layer and the spacer layer including protruding portions of the first layer and recesses defined in the first layer, and with a textured interface between the second layer and the encapsulant layer including protruding portions of the second layer arranged as a converging Fresnel lens.

FIG. 20 is a side cross-sectional schematic view of a lighting device including a first and a second electrically activated emitter arranged within a reflector cup and overlaid with a first layer containing at least one first lumiphoric material, a second layer containing at least one second lumiphoric material, and an encapsulant and/or lens, with a textured interface between the first layer and the second layer including protruding portions of the first layer arranged as a converging Fresnel lens, and with a textured interface between the second layer and the encapsulant comprising a diverging Fresnel lens.

FIG. 21 is a top plan schematic view of a lighting device including an electrically activated emitter arranged over a substrate, with the emitter being overlaid with a first layer containing at least one first lumiphoric material, and a second layer containing at least one second lumiphoric material, wherein portions of the first and second layers are concentrically arranged.

FIG. 24A is a chart including a comparison of Color Rendering Index (CRI) for a lighting device including an electrically activated emitter overlaid with a red phosphor-containing layer that is further overlaid by a yellow phosphor containing layer relative to CRI for a traditional lighting device including a lumiphor layer including red and yellow phosphor materials dispersed therein, at a correlated color temperature of 3000K.

FIG. 24B is a chart including a comparison of CRI-9 for a lighting device including an electrically activated emitter overlaid with a red phosphor-containing layer that is further overlaid by a yellow phosphor containing layer relative to CRI-9 for a traditional lighting device including a lumiphor layer including red and yellow phosphors dispersed therein, at a correlated color temperature of 3000K.

DETAILED DESCRIPTION

Figure 22:
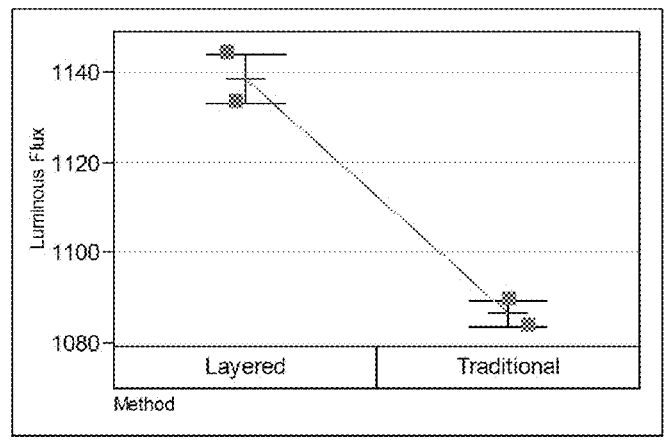
FIG. 22 is a chart including a comparison of luminous flux for a lighting device including an electrically activated emitter overlaid with a yellow phosphor-containing layer that is further overlaid by a red phosphor-containing layer, relative to luminous flux for a traditional lighting device including a lumiphor layer including red and yellow phosphor materials dispersed therein.

The present invention relates in certain aspects to lighting devices including multiple discrete layers comprising different lumiphoric materials arranged to receive light from at least one electrically activated emitter, and including between the discrete layers at least one textured interface including at least one outwardly protruding portion and/or at least one recess. Multiple texture interfaces may be provided. Use of one or more textured interfaces between lumiphoric material layers may be used to affect optical properties, affect color mixing, and/or enhance inter-layer adhesion. Method of fabricating and using such devices are further provided.

Unless otherwise defined, terms used herein should be construed to have the same meaning as commonly understood by one of ordinary skill in the art to which this invention belongs. It will be further understood that terms used herein should be interpreted as having a meaning that is consistent with their meaning in the context of this specification and the relevant art, and should not be interpreted in an idealized or overly formal sense unless expressly so defined herein.

Embodiments of the invention are described herein with reference to cross-sectional, perspective, and/or plan view illustrations that are schematic illustrations of idealized embodiments of the invention. Variations from the shapes of the illustrations as a result, for example, of manufacturing techniques and/or tolerances, are to be expected, such that embodiments of the invention should not be construed as limited to particular shapes illustrated herein. This invention may be embodied in different forms and should not be construed as limited to the specific embodiments set forth herein. In the drawings, the size and relative sizes of layers and regions may be exaggerated for clarity.

Unless the absence of one or more elements is specifically recited, the terms "comprising," "including," and "having" as used herein should be interpreted as open-ended terms that do not preclude the presence of one or more elements.

It will be understood that when an element such as a layer, region, or substrate is referred to as being "on" another element, it can be directly on the other element or intervening elements may be present. Moreover, relative terms such as "beneath" or "overlying" may be used herein to describe a relationship of one layer or region to another layer or region relative to a substrate, emitter, or another element layer as illustrated in the figures. It will be understood that these terms are intended to encompass different orientations of the device in addition to the orientation depicted in the figures. The term "directly" is utilized to mean that there are no intervening elements.

The terms "electrically activated emitter" and "emitter" as used herein refers to any device capable of producing visible or near visible (e.g., from infrared to ultraviolet) wavelength radiation, including but not limited to, xenon lamps, mercury lamps, sodium lamps, incandescent lamps, and solid state emitters, including diodes (LEDs), organic light emitting diodes (OLEDs), and lasers.

The terms "solid state light emitter" or "solid state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials.

Solid state light emitting devices according to embodiments of the invention may include III-V nitride (e.g., gallium nitride) based LEDs or lasers fabricated on a silicon carbide, sapphire, or III-V nitride substrate, including (for example) devices manufactured and sold by Cree, Inc. of Durham, N.C. Such LEDs and/or lasers may be configured to operate such that light emission occurs through the substrate in a so-called "flip chip" orientation. Such LEDs and/or lasers may also be devoid of substrates (e.g., following substrate removal).

Electrically activated light emitters (including solid state light emitters) may be used individually or in combination with one or more lumiphoric materials (e.g., phosphors, scintillators, lumiphoric inks, quantum dots) and/or optical elements to generate light at a peak wavelength, or of at least one desired perceived color (including combinations of colors that may be perceived as white). Inclusion of lumiphoric (also called 'luminescent') materials in lighting devices as described herein may be accomplished by direct coating on electrically activated light emitters (e.g., by powder coating, inkjet printing, or the like), adding such materials to encapsulants, adding such materials to lenses, by embedding or dispersing such materials within lumiphor support elements, and/or coating such materials on lumiphor support elements. Other materials, such as light scattering elements (e.g., particles) and/or index matching materials, may be associated with a lumiphor, a lumiphor binding medium, or a lumiphor support element.

The expression "peak wavelength", as used herein, means (1) in the case of a solid state light emitter, to the peak wavelength of light that the solid state light emitter emits if it is illuminated, and (2) in the case of a luminescent material, the peak wavelength of light that the luminescent material emits if it is excited.

A wide variety of wavelength conversion materials (e.g., luminescent materials, also known as lumiphors or luminophoric media, e.g., as disclosed in U.S. Pat. No. 6,600,175 and U.S. Patent Application Publication No. 2009/0184616), are well-known and available to persons of skill in the art. Examples of luminescent materials (lumiphors) include phosphors, scintillators, day glow tapes, nanophosphors, quantum dots (e.g., such as provided by NNCrystal US Corp. (Fayetteville, Ark.)), and inks that glow in the visible spectrum upon illumination with (e.g., ultraviolet) light. Inclusion of lumiphors in LED devices has been accomplished by providing layers (e.g., coatings) of such materials over solid state emitters and/or by dispersing luminescent materials to a clear encapsulant (e.g., epoxy-based or silicone-based curable resin or other polymeric matrix) arranged to cover one or more solid state light emitters. One or more luminescent materials useable in devices as described herein may be down-converting or up-converting, or can include a combination of both types.

Various embodiments include lumiphoric materials and/or lumiphor support elements that are spatially segregated (i.e., remotely located) from one or more electrically activated emitters. In certain embodiments, such spatial segregation may involve separation of a distance of at least about 1 mm, at least about 2 mm, at least about 5 mm, or at least about 10 mm. Lumiphoric materials may be supported by or within one or more lumiphor support elements, such as (but not limited to) glass layers or discs, polymeric material layers, optical elements, or layers of similarly translucent or transparent materials capable of being coated with, or including (e.g., embedded) therein, lumiphoric material. In certain embodiments, lumiphoric material may be embedded or dispersed in a lumiphor support element.

Some embodiments of the present invention may use solid state emitters, emitter packages, fixtures, luminescent materials/elements, power supplies, control elements, lumiphoric materials, and/or methods such as described in U.S. Pat. Nos. 7,564,180; 7,456,499; 7,213,940; 7,095,056; 6,958,497; 6,853,010; 6,791,119; 6,600,175; 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918,497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, 2006/0221272 and/or 2011/0220920; with the disclosures of the foregoing patents and published patent applications being hereby incorporated by reference as if set forth fully herein.

The expression "lighting device", as used herein, is not limited, except that it is capable of emitting light. That is, a lighting device can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or backlighting (e.g., backlight poster, signage, LCD displays), bulb replacements (e.g., for replacing AC incandescent lights, low voltage lights, fluorescent lights, etc.), outdoor lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting-work lights, etc., mirrors/vanity lighting, or any other light emitting device.

The inventive subject matter further relates in certain embodiments to an illuminated enclosure (the volume of which can be illuminated uniformly or non-uniformly), comprising an enclosed space and at least one lighting device as disclosed herein, wherein the lighting device illuminates at least a portion of the enclosure (uniformly or non-uniformly). The inventive subject matter further relates to an illuminated area, comprising at least one item, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, a LCD display, a cave, a tunnel, a yard, a lamppost, etc., having mounted therein or thereon at least one lighting device as described herein.

In certain embodiments, lighting devices as described herein including at least one electrically activated (e.g., solid state) emitter with a peak wavelength in the visible range. In certain embodiments, multiple electrically activated (e.g., solid state) emitters are provided, with such emitters optionally being independently controllable. In certain embodiments, lighting devices as described herein include a first LED comprising a first LED peak wavelength, and comprises a second LED comprising a second LED peak wavelength that differs from the first LED peak wavelength by at least 20 nm. In such a case, each of the first wavelength and the second wavelength is preferably within the visible range.

In certain embodiments, a first layer includes at least one first lumiphoric material that adapted to emit any of yellow, red, and green light; and a second layer includes at least one second lumiphoric material that is adapted to emit any of yellow, red, and green light. Such lumiphoric materials may be arranged to be stimulated by at least one of a UV, blue, cyan, or green solid state emitter. Individual lumiphoric material layers may include lumiphoric materials of a single composition, or multiple lumiphoric materials of different compositions may be dispersed in a single lumiphoric material layer.

In some embodiments, lighting devices may include a blue LED and/or a cyan LED in combination with a lumiphoric material containing layers that include first, second and third phosphors therein. A first phosphor may down-convert light received from the blue LED to light having a peak wavelength in the green color range. This phosphor may have a sufficiently broad full width half maximum (FWHM) bandwidth such that its FWHM emission spectra falls into at least part of the cyan color range. In some embodiments, this first phosphor may comprise a LuAG:Ce phosphor (i.e., cerium doped LuAG). LuAG:Ce phosphors may have a peak emission wavelength of between 535 and 545 nanometers, and a FWHM bandwidth of between about 110-115 nanometers. As such, the FWHM bandwidth of LuAG:Ce phosphors may extend throughout the entire cyan color range. A second phosphor may down-convert light received from the blue LED and/or cyan LED to light having a peak wavelength in the yellow color range. In some embodiments, this second phosphor may comprise a YAG:Ce phosphor. A third phosphor may down-convert light received from the blue LED and/or cyan LED to light having a peak wavelength in the red color range. In some embodiments, this third phosphor may comprise a $(Ca_{1-x}Sr_x)SiAlN_3:Eu^{2+}$ phosphor.

In some embodiments, a LuAG:Ce phosphor and a YAG:Ce could be grown together in a single cerium-doped structure (e.g., layer) that includes lutetium, yttrium, aluminum and oxygen. For example, the LuAG:Ce phosphor and the YAG:Ce could be implemented together as a $Lu_{1-x}Y_xAl_5O_{12}$:Ce material. Such a material would act as both a first phosphor that emits light like a LuAG:Ce phosphor and a second phosphor that emits light like a YAG:Ce phosphor (which would provide a combined spectrum having a peak between the peak wavelength of the LuAG:Ce phosphor and the peak wavelength of the YAG:Ce phosphor). Thus, it will be appreciated that the first and second phosphors may comprise two separate phosphors, two separate phosphors that are mixed together, and/or a composition in which both phosphors are grown together in the same structure.

It will also be appreciated that in some embodiments, a first phosphor may comprise a first aluminum garnet-based phosphor, a second phosphor may comprise a second aluminum garnet-based phosphor, and a third phosphor comprises a nitride- or oxynitride-based phosphor. In some of these embodiments, the first phosphor may emit light in the green color range and the second phosphor may emit light in the yellow color range. In some embodiments, the first phosphor may comprise a LuAG:Ce phosphor or may comprise any other aluminum garnet-based phosphor, and the second phosphor may comprise a YAG:Ce or may comprise any other aluminum garnet-based phosphor. The third phosphor may comprise any suitable nitride- or oxynitride-based phosphor, and is not limited to calcium and strontium based nitride- or oxynitride-based phosphors. It will be understood that the use of first and second aluminum garnet-based phosphors may have certain advantages in particular implementations, as the two aluminum garnet-based phosphors may have good compatibility when they are, for example, mixed together in a binder, and as aluminum garnet-based phosphors may exhibit good stability and have other desirable features for use in lumiphoric media.

Presence of multiple lumiphoric materials (e.g., arranged to output yellow, red, green, and/or other colors) may beneficially enhance color rendering index performance of lighting devices according to the present invention.

Certain embodiments of the present invention relate to use of solid state emitter packages. A solid state emitter package typically includes at least one solid state emitter chip that is enclosed with packaging elements to provide environmental and/or mechanical protection, color selection, and light focusing, as well as electrical leads, contacts, and/or traces enabling electrical connection to an external circuit. Encapsulant material, optionally including lumiphoric material, may be disposed over lumiphor-containing layers and solid state emitters in a solid state emitter package. Multiple solid state emitters may be provided in a single package. A package including multiple solid state emitters may include at least one of the following features: a single leadframe arranged to conduct power to the solid state emitters, a single reflector (e.g., a reflector cup) arranged to reflect at least a portion of light emanating from each solid state emitter, a single submount supporting each solid state emitter, and a single lens arranged to transmit at least a portion of light emanating from each solid state emitter.

Individual emitters in a solid state emitter package, or groups of emitters (e.g., wired in series) in a solid state emitter package, may be separately controlled. Multiple solid state emitter packages may be arranged in a single solid state lighting device. Individual solid state emitter packages or groups of solid state emitter packages (e.g., wired in series) may be separately controlled. Separate control of individual emitters, groups of emitters, individual packages, or groups of packages, may be provided by independently applying drive currents to the relevant components with control elements known to those skilled in the art. In one embodiment, at least one control circuit a may include a current supply circuit configured to independently apply an on-state drive current to each individual solid state emitter, group of solid state emitters, individual solid state emitter package, or group of solid state emitter packages. Such control may be responsive to a control signal (optionally including at least one sensor arranged to sense electrical, optical, and/or thermal properties and/or environmental conditions), and a control system may be configured to selectively provide one or more control signals to the at least one current supply circuit. In various embodiments, current to different circuits or circuit portions may be pre-set, user-defined, or responsive to one or more inputs or other control parameters.

Certain embodiments of the present invention further relate to the use of light fixtures include multiple electrically activated (e.g., solid state) emitters as disclosed herein. Multiple emitters may be arranged on a single substrate and/or mounting plate, whether individually or as part of multi-chip packages or other multi-chip lamps. Any desirable number of electrically activated emitters may be incorporated into a light fixture. Each electrically activated emitter or emitter-containing package in a single fixture may be substantially identical to one another, or emitters (or emitter-containing packages) with different output characteristics may be intentionally provided in a single light fixture. A light fixture may include one or more control circuits arranged in electrical communication with electrically activated emitters and/or emitter packages contained in or supported by the fixture.

As noted previously, embodiments of the invention relate to lighting devices including discrete layers containing different lumiphoric materials (e.g., lumiphoric material that are compositionally different from one another), wherein at least one surface of at least one of the discrete layers (e.g., along an interface between discrete layers) includes textured features such as at least one outwardly protruding portion and/or at least one recess. At least one protruding portion and/or at least one recess has a height or depth of preferably at least about 3 micrometers, or at least about 5 micrometers, or preferably at least about 10 micrometers, or preferably at least about 15 micrometers, or preferably at least about 20 micrometers. In certain embodiments, recesses do not penetrate or extend through the entire thickness of a layer. In certain embodiments, protrusions and/or recesses defined on or in a lumiphoric material-containing layer have regularized height or depth, such as with a variation in height or depth of preferably less than about 30%, more preferably less than about 20%, and still more preferably less than about 10% among multiple (or substantially all) protrusions and/or recesses defined on or in such a layer.

Each discrete layer may include at least one lumiphoric material (e.g., at least one phosphor) and a binder material, and in certain embodiments, a first discrete layer comprises a binder material that is compositionally different from a binder material contained in a second discrete layer (e.g., use of silicone versus epoxy as a binder material in different discrete layers). In certain embodiments, binder materials used in different layers as described herein are compositionally different and/or have different indices of refraction relative to one another. In certain embodiments, discrete lumiphoric material-containing layers may include or have associated therewith one or more additional items such as diffusing elements, polarizing elements, light scattering elements (e.g., scattering particles), anti-reflective elements, with any one or more of the foregoing elements being arrangeable as a sublayer, interlayer, or coating. In certain embodiments, compositional differences layers are attributable at least in part to presence or absence of light scattering materials. For example, at least one of a first encapsulant material layer and a second encapsulant material layer may include at least one light scattering material, wherein at least one of presence, concentration, amount, average particle size, and distribution of the at least one light scattering material differs between the first (encapsulant) layer and the second (encapsulant) layer.

Protrusions and recesses in discrete lumiphoric material-containing layers may be formed by various methods including, but not limited to: compression molding to shape portions of a layer; blade cutting to effectuate removal of a portion of a layer; cutting with pressurized fluid (e.g., liquid or gas) to effectuate removal of a portion of a layer; laser ablation (e.g., supplying laser energy to a layer to effectuate removal of a portion of the layer); chemical removal and/or etching (e.g., supplying a chemical reactant to a layer to effectuate removal of a portion of the layer); and selective deposition (e.g., via liquid jetting, electrophoresis, localized insertion of solids, or the like). In various embodiments, a mask may be applied over at least a portion of a layer, and material and/or energy may be supplied to the layer through one or more openings defined in the mask to effectuate selective curing and/or removal of portions of a layer. In certain embodiments, materials used to form one or more layers may be applied in liquid or gel form, then at least partially cured (e.g., hardened) by application of heat, light, and/or chemical reactants, followed by definition of one or more textural features (e.g., protrusions and/or recesses) by selective removal of portions of the at least partially cured layer.

In certain embodiments, protrusions and/or recesses may be regularly spaced or arranged in or on a layer. In various embodiments, protrusions and/or recesses may include side walls that are substantially perpendicular, or are non-perpendicular (e.g., angled at an obtuse angle), relative to a light emitting (e.g., upper) surface of an electrically activated emitter, or relative to a plane extending through an average or nominal height of a lumiphor material-containing layer. Protrusions and/or recesses as described herein may be provided in any suitable number and shapes on or in a lumiphoric material-containing layer, including (but not limited to) cross-sectional shapes having sawtooth, interrupted sawtooth, truncated sawtooth, square wave, interrupted square wave, sinusoidal, and other shapes. In certain embodiments, protrusions and/or recesses may be arranged as parallel or intersecting straight or curved ridges, grooves, or stripes. Protruding portions (protrusions) and recesses as described herein may also be formed as unconnected geometric shapes, connected geometric shapes, or arrays of discrete protrusions and/or recesses of any desired shapes or conformation. In certain embodiments, protrusions and/or recesses may be concentrically arranged. In certain embodiments, protrusions and/or recesses may be arranged in a two-dimensional array with regular spacing between textural features. In one embodiment, a two-dimensional array includes elements arranged in checkerboard manner. In certain embodiments, a lumiphoric material-containing layer includes at least three outwardly protruding portions, with substantially equal gaps (e.g., equal length gaps) between adjacent outwardly protruding portions. In certain embodiments, a lumiphoric material-containing layer includes at least three recesses, with substantially equal gaps between adjacent recesses.

A textured interface between lumiphoric material-containing layers of a lighting device as described herein may include multiple protrusions that differ in height relative to one another, multiple recesses that differ in depth relative to one another, and/or protrusions of the same or different heights in combination with recesses of the same or different depths. In certain embodiments, protruding portions of a first lumiphoric material-containing layer may extend through an adjacent spacer layer (e.g., a clear encapsulant or a gap) to contact a second lumiphoric material-containing layer arranged over the spacer layer. In certain embodiments, protruding portions of a first lumiphoric material-containing layer may extend through an adjacent second lumiphoric material-containing layer into contact with either a third lumiphoric material-containing layer or an encapsulant layer (such that a lateral wall of one or more protrusions is in contact with both a second lumiphoric material-containing layer and either a third lumiphoric material-containing layer or an encapsulant layer. In certain embodiments, recesses defined in a first lumiphoric material-containing layer may be partially filled with a second lumiphoric material-containing layer and thereafter filled with a third lumiphoric material-containing layer, such that a lateral wall of one or more recesses is in contact with both a second lumiphoric material-containing layer and a third lumiphoric material-containing layer.

In certain embodiments, a first textured interface is provided between first and second lumiphoric material-containing layers, and a second textured interface between second and third lumiphoric material-containing layers of a lighting device, with each textured interface including at least one outwardly protruding portion having a height of at least 5 micrometers and/or at least one recess having a depth of at least 5 microns (or greater height/depth thresholds as recited herein). Each of the first, second, and third lumiphoric materials may be compositionally different.

In certain embodiments, a first lumiphoric material includes a first peak wavelength, a second lumiphoric material includes a second peak wavelength, and the second peak wavelength is at least about 50 nm greater than the first peak wavelength. In certain embodiments, at least one first lumiphoric material includes a first peak wavelength in a range of from 500 nm to 590 nm, and at least one second lumiphoric material comprises a second peak wavelength in a range of from 591 nm to 750 nm. In certain embodiments, at least one first lumiphoric material includes a first peak wavelength in a range of from 570 nm to 590 nm, and at least one second lumiphoric material comprises a second peak wavelength in a range of from 610 nm to 750 nm. In certain embodiments, at least one first lumiphoric material includes a first peak wavelength in a range of from 591 nm to 750 nm, and at least one second lumiphoric material comprises a second peak wavelength in a range of from 500 nm to 590 nm. In each of the preceding three embodiments, the at least one first lumiphoric material may be arranged between at least one electrically activated emitter and the at least one second lumiphoric material (i.e., with the second lumiphoric material overlying the at least one first lumiphoric material).

In certain embodiments, a layer containing lumiphoric material may include discrete subregions including lumiphoric materials with different concentrations and/or compositionally different lumiphoric materials. Such subregions may abut one another or be laterally spaced apart from one another. In certain embodiments, a first lumiphoric material-containing layer may include multiple recesses defined therein, with different recesses being filled with compositionally different lumiphoric materials of a second lumiphoric material-containing layer.

In certain embodiments, at least one first lumiphoric material is substantially uniformly dispersed in the first layer, and/or at least one second lumiphoric material is substantially uniformly dispersed in the second layer. In other embodiments, at least one first lumiphoric material is non-uniformly arranged in the first layer, and/or at least one second lumiphoric material is non-uniformly arranged in the second layer, such that lumiphoric material concentration may vary within a layer (e.g., in disconnected subregions of a layer).

In certain embodiments, a layer containing lumiphoric material may be continuous in character and devoid of unconnected segments. In other embodiments, a layer containing a lumiphoric material may be discontinuous in character, with at least two segments not in contact with one another. In certain embodiments, a first lumiphoric material-containing layer overlies an entirety of at least one electrically activated emitter. In certain embodiments, a second lumiphoric material-containing layer overlies an entirety of a first lumiphoric material-containing layer. In other embodiments, a first lumiphoric material-containing layer overlies only selected portions of an electrically activated emitter, and/or a second lumiphoric material-containing layer overlies only selected portions (i.e., less than an entirety) of a first lumiphoric material-containing layer.

In certain embodiments, one or more lumiphoric material-containing layers include a textured interface with an average height or depth arranged along a single plane. In other embodiments, one or more lumiphoric material-containing layers include a textured interface with an average height or depth arranged along a multiple planes, such as (but not limited to) a curvilinear or hemispherical configuration. In certain embodiments, a lighting device including discrete lumiphoric material-containing layers as described herein comprises a substantially flat light emitting outer surface; in other embodiments, a lighting device comprises a curvilinear or hemispherical light emitting outer surface.

In certain embodiments, at least one surface of a first layer and/or a second layer (e.g., such as an interface between a lumiphoric material-containing layer and an encapsulant and/or a different lumiphoric material-containing layer) is arranged as a lens, such as a collimating lens, a focusing lens, a diverging lens, or a Fresnel lens (e.g., either focusing or diverging in character). In certain embodiments, a single lighting device may include lumiphoric material-containing layers defining multiple lenses arranged in series.

In certain embodiments, lumiphoric material-containing layers may be applied to an electrically activated solid state emitter prior to or after mounting of the emitter on a support surface (e.g., reflector, submount, or other substrate). In certain embodiments, lumiphoric material-containing layers may be applied over at least portions of one or more electrically activated emitters previously arranged within a cavity or space bounded by at least one lateral bounding element, such as a dam wall and/or reflector cup wall, with edge portions of the lumiphoric material-containing layers contacting at least one wall of the lateral bounding element(s). That is, at least one electrically activated emitter may be arranged within a cavity or space bounded by at least one lateral bounding element, and discrete lumiphoric material-containing layers may be applied over the at least one emitter.

In certain embodiments, a first lumiphoric material-containing layer is arranged to receive light from at least one electrically activated emitter, a second lumiphoric material-containing layer is arranged to overlie the first layer (e.g., to receive emissions from the first layer), and an additional layer (which may include a third lumiphoric material or be devoid of lumiphoric material) may be arranged to overlie the second layer and to receive emissions from the second layer, wherein at least one surface of the first layer and the second layer (e.g., top or bottom surface of one or both of the first and second layer) is textured with at least one of the following features (i) and (ii): at least one outwardly protruding portion comprising a height of at least 5 micrometers; and at least one recess comprising a depth of at least 5 micrometers. Textured features on one or more surfaces may comprise at least one lens, such as Fresnel lens and/or a collimating, converging, or diverging lens. In certain embodiments, the first layer is arranged in contact with the second layer. In certain embodiments, the second layer is arranged in contact with the additional layer. In certain embodiments, the additional layer is proximate to a light-emitting end of the lighting device. In certain embodiments, the first layer is spatially segregated from the at least one electrically activated emitter, such as by an intervening gap or an intervening material. In certain embodiments, the first layer may be arranged on a lumiphor support element such as a lens or other support.

In certain embodiments, a method for fabricating a lighting device includes depositing a first layer comprising at least one first lumiphoric material over at least a portion of at least one electrically activated emitter; forming at least one of (i) at least one outwardly protruding feature on the first layer having a height of at least 5 micrometers (or another height threshold as recited herein) and/or (ii) at least one recess in the first layer having a depth of at least 5 micrometers (or another depth threshold as recited herein) in the first layer; and depositing a second layer including at least one second lumiphoric material over at least a portion of the first layer and arranged to be stimulated by emissions of the electrically activated emitter(s). In certain embodiments, the forming step includes applying a compression mold to the first layer, at least partially curing the first layer, and removing the mold, prior to deposition of the second layer. In certain embodiments, the first layer may be applied in liquid or gel form, and at least partially cured prior to the forming step. Any method for forming features in or on a layer as disclosed herein may be used after partial curing (e.g., including but not limited to fluid shaping or cutting, blade cutting, laser shaping or cutting, chemical removal, and the like).

Lighting devices according to certain embodiments may include multiple lumiphoric material-containing layers with at least one textured interface arranged over portions of or all of one surface of an electrically activated emitter, or over portions of or all of multiple surfaces of an electrically activated emitter.

FIGS. 1-6 illustrate electrically activated emitters each including an upper surface that is overlaid by multiple lumiphoric material-containing layers. Although not illustrated in FIGS. 1-6, it is to be appreciated that lumiphoric material-containing layers may be arranged over more than one surface (e.g., side walls and upper surfaces) of an electrically activated emitter, and lumiphoric material may be selectively arranged (e.g., deposited or removed) along one or more portions of at least one surface of an electrically activated emitter without being arranged over all portions of the at least one surface.

FIG. 1 is a side cross-sectional schematic view of a lighting device 100 according to one embodiment including an electrically activated emitter 101 overlaid along an upper surface 102 thereof with a first layer 110 containing at least one first lumiphoric material and overlaid with a second layer 120 containing at least one second lumiphoric material, including a textured interface 115 between the first layer 110 and the second layer 120 including protruding portions 111 (extending into the second layer 120) and recesses 112. The protruding portions 111 and recesses 112 include lateral walls that are substantially perpendicular to an upper surface 102 of the emitter 101, and are substantially perpendicular to an average or nominal height of the first layer along interface 115. As illustrated in FIG. 1, the cross-sectional shape of each protrusion 111 and recess 112 is rectangular. In operation of the device 100, light may be generated by the emitter 101 and transmitted into the first layer 110, with light transmitted through and/or emitted by the first layer being transmitted into the second layer 120, and with light transmitted through and/or emitted by the second layer being transmitted through an upper surface 128 of the device 100, with the surface optionally embodying a light emitting end 128 of the device 100. Additional layers (e.g., additional lumiphoric material containing layers, encapsulant materials, and/or lenses) may be optionally arranged over the second layer 120 in further embodiments. Aggregated emissions may include portions of the emissions of the emitter 101, the first layer 110, and the second layer 120.

FIG. 2 is a side cross-sectional schematic view of a lighting device 200 according to one embodiment including an electrically activated emitter 201 overlaid along an upper surface 202 thereof with a first layer 210 containing at least one first lumiphoric material and overlaid with a second layer 220 containing at least one second lumiphoric material, including a textured interface 215 between the first layer 210 and the second layer 220 including protruding portions 211 (extending into the second layer 220) and recesses 212. Each of the protruding portions 211 and recesses 212 including lateral walls that contact the second layer 220 and that are non-perpendicular to the second the upper surface 202 of the emitter 201. As illustrated in FIG. 2, the cross-sectional shape of each protrusion 211 and recess 212 is trapezoidal (i.e., forming a truncated triangle). An upper surface 228 of the second layer 220 may constitute a light emitting end of the device 200, or may be overlaid by one or more additional layers (not shown).

FIG. 3 is a side cross-sectional schematic view of a lighting device 300 according to one embodiment including an electrically activated emitter 301 overlaid along an upper surface 302 thereof with a first layer 310 containing at least one first lumiphoric material and a second layer 320 containing at least one second lumiphoric material, with a textured interface 315 between the first layer 310 and the second layer 320 including protruding portions 311 (extending into the second layer 320) including lateral walls that contact the second layer 320 and that are non-perpendicular to the second the upper surface 302 of the emitter 301. As illustrated in FIG. 3, the cross-sectional shape of each protrusion 311 is triangular, forming a sawtooth-shaped interface between the first layer 310 and second layer 320. An upper surface 328 of the second layer 320 may constitute a light emitting end of the device 300, or may be overlaid by one or more additional layers (not shown).

FIG. 4 is a side cross-sectional schematic view of a lighting device 400 according to one embodiment including an electrically activated emitter 401 overlaid along an upper surface 402 thereof with a first layer 410 containing at least one first lumiphoric material and overlaid with a second layer 420 containing at least one second lumiphoric material, with a textured interface 415 between the first layer 410 and the second layer 420. The interface 415 includes protrusions 411A, 411B of different heights. A gap extending between the taller protrusions 411A (and including a shorter protrusion 411B therein) may be considered a recess 412, with lateral walls of the taller protrusions 411A arranged in contact with both the second layer 420 and an overlying encapsulant layer 440. In other words, a lower portion of each recess 412 is filled with the second layer 420, and an upper portion of each recess 412 is filled with the encapsulant 440. Although not shown in FIG. 4, according to an alternative embodiment the encapsulant layer 440 may be replaced with a third lumiphoric material-containing layer. Each of the protruding portions 411A, 411B is trapezoidal in shape, forming a truncated triangle, with lateral walls being angled non-perpendicular to the upper surface of the electrically activated emitter 401. An upper surface 448 of the encapsulant layer 440 may constitute a light emitting end of the device 400, or may be overlaid by one or more additional layers (not shown).

FIG. 5 is a side cross-sectional schematic view of a lighting device 500 according to one embodiment including an electrically activated emitter 501 overlaid along an upper surface 502 thereof with a first layer 510 containing at least one first lumiphoric material, overlaid with a second layer 520 containing at least one second lumiphoric material, and overlaid with a third layer 530 containing at least one third lumiphoric material. One textured interface 515 including protruding portions 511 (extending into the second layer 520) is arranged between the first layer 510 and the second layer 520, and another textured interface 525 including protruding portions 521 (extending into the third layer 530) is arranged between the second layer 520 and the third layer 530. The protruding portions 511, 521 are triangular in shape with lateral walls being non-perpendicular to the upper surface 502 of the emitter 501, and each textured interface 515, 525 embodies an interrupted sawtooth shape in cross-section. As shown in FIG. 5, gaps 512 are provided between groups of protrusions 511 extending from the first layer 510, and gaps 522 are provided between groups of protrusions 521 extending from the second layer 520, with the protruding portions 511 of the first layer 510 being offset from (i.e., not aligned with) protruding portions 512 of the second layer 520. An upper surface 538 of the third layer 530 may constitute a light emitting end of the device 500, or may be overlaid by one or more additional layers (not shown).

FIG. 6 is a side cross-sectional schematic view of a lighting device 600 according to one embodiment including an electrically activated emitter 601 overlaid along an upper surface 602 thereof with a first layer 610 containing at least one first lumiphoric material, overlaid with a spacer layer 640 (optionally including a clear encapsulant material, or being devoid of material), and overlaid with a second layer 620 containing at least one second lumiphoric material. A textured interface 615 including protruding portions 611 extending into the spacer layer 640 (with groups of protruding portions 611 being separated laterally by gaps 612) is arranged between the first layer 610 and the spacer layer 640. The protruding portions 611 are triangular in shape with lateral walls being non-perpendicular to the upper surface 602 of the emitter 601, and the textured interface 615 embodies an interrupted sawtooth shape in cross-section. As illustrated in FIG. 6, an interface 645 between the spacer layer 640 and the second layer 620 is devoid of textural features. An upper surface 628 of the second layer 620 may constitute a light emitting end of the device 600, or may be overlaid by one or more additional layers (not shown).

In certain embodiments, an electrically activated emitter may be overlaid by various layers along multiple surfaces thereof. For instance, FIG. 7 is a side cross-sectional schematic view of a lighting device 700 according to one embodiment including an electrically activated emitter 701 overlaid with a first layer 710 containing at least one first lumiphoric material extending over a top surface 702 and side walls 703, 704 of the emitter 701, and overlaid with a second layer 720 containing at least one second lumiphoric material extending (e.g., a top surface and side walls of) the first layer 701. The device includes a textured interface 715 between the first layer 710 and the second layer 720 with outwardly protruding portions 711 extending into the second layer, with lateral walls of the protruding portions 711 in contact with the second layer 720. An upper surface 728 of the second layer 720 may constitute a light emitting end of the device 700, or may be overlaid by one or more additional layers (not shown).

In certain embodiments, an electrically activated emitter may be overlaid by hemispherical layers. For instance, FIG. 8 is a side cross-sectional schematic view of a lighting device 800 according to one embodiment including an electrically activated emitter 801 overlaid with a hemispherical first layer 810 containing at least one first lumiphoric material extending over a top surface 802 and side walls 803, 804 of the emitter 801, overlaid with a hemispherical second layer 820 containing at least one second lumiphoric material extending over the first layer 810, and overlaid with a hemispherical encapsulant 840 extending over the second layer 820. One textured interface 815, including protruding portions 811 of the first layer 810 and recesses 812 defined in the first layer 810, is arranged between the first layer 810 and second layer 820. Another textured interface 825, including protruding portions 821 of the second layer 820 and recesses 822 defined in the second layer 820, is arranged between the second layer 820 and the encapsulant layer 840. An outer surface 848 of the encapsulant layer 840 may constitute a light emitting end of the device 800, or may be overlaid by one or more additional layers (not shown).

FIGS. 9A-9E illustrate various stages of a method for producing a lighting device 900 according to one embodiment. FIG. 9A is a top schematic view of an electrically activated emitter 901. FIG. 9B is a top plan schematic view of the emitter 901 of FIG. 9A overlaid with a first layer 910 containing at least one first lumiphoric material. Although FIG. 9B illustrates the lateral extent of the first layer 910 extending beyond lateral edges of the emitter 901, in certain embodiments the first layer 910 may cover only an upper surface of the emitter 901. FIG. 9C is a top plan schematic view of the emitter 901 and first layer 910 of FIG. 9B after formation of features (e.g., recesses 912) in top and side surfaces of the first layer 910 according to any forming technique as disclosed herein. FIG. 9D is a top plan schematic view of the emitter 910 and first layer 910 of FIG. 9C further overlaid with a second layer 910 containing at least one second lumiphoric material to form the device 900, and FIG. 9E is a side cross-sectional schematic view of the device 900 of FIG. 9D. An upper surface 928 of the second layer 920 may constitute a light emitting end of the device 900, or may be overlaid by one or more additional layers (not shown).

FIGS. 10A-10D illustrate various elements of an apparatus, and stages of a method, for producing a lighting device according to one embodiment. FIG. 10A is a side cross-sectional schematic view of an electrically activated solid state emitter 1001 overlaid (over a top surface 1002 and side walls 1003, 1004 thereof) with a first layer 1010 containing at least one lumiphoric material and having a hemispherical surface 1019 prior to formation of textured features in or on the surface 1019. The emitter 1001 and first layer 1010 are positioned under a compression die 1060 including a cavity 1065 having protrusions 1062 and recesses 1061 defined therein to define corresponding recesses and protrusions in the first layer 101 following contact thereof. The compression die 1060 optionally includes channels 1069 for conducting material (e.g., material for forming the first layer 1010) either to or from the cavity 1065. FIG. 10B is a side cross-sectional schematic view of the electrically activated solid state emitter 1001 and first layer 1020 of FIG. 10A following formation of protrusions 1011 and recesses 1012 in the first layer 1010 by application of the compression die 1060 to the outer surface 1019 of the first layer 1010. FIG. 10C is a side cross-sectional schematic view of the emitter 1001 and first layer 1010 of FIG. 10B overlaid with a second layer 1020, following removal of a hemispherical die 1070 with a cavity 1075 used to shape the second layer 1020. FIG. 10D is a side cross-sectional schematic view of the emitter 1001, first layer 1010, and second layer 1020 of FIG. 10C following formation of an encapsulant layer 1040 over the second layer 1020. An upper surface 1048 of the second layer 1020 may constitute a light emitting surface of the device 1000, or may be overlaid by one or more additional layers or structures (not shown).

Various lighting devices as described herein may be embodied in, or may include, one or more solid state emitter packages. Referring to FIG. 11, an exemplary emitter package 400 may include multiple electrically activated emitters 1101A, 110B (e.g., LED chips manufactured by Cree, Inc., Durham, N.C.) with integral conductive substrates. Although only two solid state emitter chips 1101A, 1101B are depicted in the package 1100 according to FIG. 11, it is to be appreciated that any desirable number of solid state emitter chips may be provided in a single package and/or group of solid state emitter packages. The emitters 1101A, 1101B may be vertical devices including anode and cathode contacts on opposing faces, respectively. The solid state emitters 1101A, 1101B may be mounted in a flip-chip configuration, with light emitting upward through substrates of the emitters 1101A, 1101B. Flip-chip mounting is not required; in other embodiments, solid state emitter chips may be mounted with substrate portions thereof proximate to a submount 1105 or other supporting structure. Wirebond connections 1108, 1109 may connect external leads 1106A, 1106B with the emitter chips 1101A, 1101B and/or conductive traces on the submount 1105. The electrical leads 1106A, 1106B may extend laterally outward past side edges of a body structure 1150 containing the submount 1105. The submount 1105 and solid state emitters 1101A, 1101B are arranged in a reflector cup 1154 along an upper surface (or optionally integrated with) the package body structure 1150. The body structure 410 may comprise an electrically insulating material such as a molded polymeric composition and/or a ceramic material. Disposed within a central portion of the body 1150 is a heatsink 1107, which extends between the submount 1105 and a lower surface of the body 410. The heatsink 1107 may be integrally formed with, or joined to, a leadframe encompassing the externally accessible leads 1106A, 1106B.

Within the reflector cup 1154, the solid state emitters 1101A, 1101B are overlaid with a first layer 1110 including at least one first lumiphoric material, overlaid with a second layer 1120 including at least one second lumiphoric material, and overlaid with an encapsulant and/or lens 1140. An interface 1115 between the first layer 1110 and the second layer 1120 is textured with numerous protruding portions 1111 of the first layer 1110 extending upward into the second layer 1120, but not penetrating through the entire thickness of the second layer 1120. Another interface 1125 between the second layer and the encapsulant and/or lens 1140 is depicted without addition of protrusions or recesses, but it is to be appreciated that such interface 1125 may be optionally textured in any manner as described herein. The encapsulant and/or lens 1140 may be hemispherical in shape with a rounded light emitting surface 1148 as shown in FIG. 11, or may be flat (e.g., as depicted in the embodiment according to FIG. 12). In operation of the package 1100, electric current is applied between the leads 1106A, 1106B to energize the emitters 1101A, 110B, with at least a portion of the resulting emissions of at least one of the emitters 1101A, 1101B used to stimulate lumiphoric materials contained in the first layer 1110 and second layer 1120. Aggregated emissions from the package 1100 may include combined emissions from the first emitter 1101A, second emitter 1101B, lumiphoric material(s) contained in the first layer 1110, and lumiphoric material(s) contained in the second layer 1120. An upper surface 1148 of the encapsulant and/or lens 1140 may constitute a light emitting surface of the device 1100, or may be overlaid by one or more additional layers or structures (not shown). A similar solid state emitter package and fabrication details regarding same are provided in U.S. Pat. No. 7,655,957 to Loh, et al., which is incorporated by reference herein.

FIG. 12 illustrates a lighting device 1200 according to another embodiment, including an electrically activated emitter 1201 mounted over a floor 1251 of a reflector cup 1254 defined in a body structure 1250, with wirebonds 1208, 1209 providing electrical communication with the emitter 1201. The electrically activated emitter 1201 is overlaid with a first layer 1210 including at least one first lumiphoric material and is overlaid with a second layer 1220 including at least one second lumiphoric material. An interface 1215 between the first and second layers 1210, 1220 is textured with numerous protruding portions 1211 of the first layer 1210 extending upward into the second layer 1220, with lateral walls of the protrusions 1211 contacting the second layer 1220. An upper (outer) surface 1228 of the second layer 1220 may be flat and/or flush with an upper surface of the body structure 1250, as depicted in FIG. 12. Although not shown, additional lumiphor-containing layers, and an encapsulant and/or lens may be further provided.

FIG. 13 illustrates a lighting device 1300 according to another embodiment, including an electrically activated emitter 1301 mounted over a floor 1351 of a reflector cup 1354 defined in a body structure 1350, with wirebonds 1308, 1309 providing electrical communication with the emitter 1301. The electrically activated emitter 1301 is overlaid with a first layer 1310 including at least one first lumiphoric material, overlaid with a second layer 1320 containing at least one second lumiphoric material (including one portion 1320A containing a one second lumiphoric material and another portion 1320B containing at least a second lumiphoric material of a different composition or amount relative to the portion 1320A), overlaid with a third layer 1330 containing at least one third lumiphoric material, and overlaid with an encapsulant and/or lens 1340 provided over the third layer 1330. The different portions 1320A, 1320B of the second layer 1320 are segregated along a boundary 1319. A first textured interface 1315 is provided between the first layer 1310 and the second layer 1320, including protruding portions 1311A of the first layer 1310 extending into one portion 1320A of the second layer 1320, and protruding portions 1311B of the first layer 1310 extending into another portion 1320B of the second layer 1320. A second textured interface 1325 is provided between the second layer 1320 and the third layer 1320, including protruding portions 1311A (extending from one portion 1320A of the second layer 1320 into the third layer 1330) and 1311B (extending from another portion 1320B of the second layer 1320 into the third layer 1330). A further interface 1335 between the third layer 1330 and the encapsulant and/or lens 1340 is devoid of textural features, but it is to be appreciated that textural features as described herein may be added to such interface 1335 according to alternative embodiments. An upper surface 1348 of the encapsulant and/or lens 1340 may constitute a light emitting surface of the device 1300, or may be overlaid by one or more additional layers or structures (not shown).

In certain embodiments, at least one surface of a lumiphor-containing layer may be arranged as a Fresnel lens. For example, FIG. 14 is a side cross-sectional schematic view of a lighting device 1400 including an electrically activated emitter 1401 mounted over a floor 1451 of a reflector cup 1454 defined in a body structure 1450, with wirebonds 1508, 1509 providing electrical communication with the emitter 1401. The electrically activated emitter 1401 is overlaid with a first layer 1410 including at least one first lumiphoric material, overlaid with a second layer 1420 containing at least one second lumiphoric material, and overlaid with an encapsulant and/or lens 1440 provided over the second layer 1420. A first textured interface 1415 is provided between the first and second layers 1410, 1420 and includes protruding portions 1411 of the first layer 1410 that extend into the second layer 1420. A second textured interface 1425 is provided between the second layer 1420 and the encapsulant and/or lens material 1440, and includes protruding portions 1421 of the second layer 1420 that extend into the encapsulant and/or lens material 1440. The protruding portions 1421 of the second layer 1420 embody a diverging Fresnel lens arranged to emit a wide beam. An upper surface 1440 of the encapsulant and/or lens material 1440 may constitute a light emitting surface of the device 1400, or may be overlaid by one or more additional layers or structures (not shown).

In certain embodiments, lighting devices include discrete lumiphor-containing layers that are spatially segregated from electrically activated emitters, such as illustrated in FIGS. 15-16.

FIG. 15 is a side cross-sectional schematic view of a lighting device 1500 including an electrically activated emitter 1501 mounted over a floor 1551 of a reflector cup 1554 defined in a body structure 1550, with wirebonds 1508, 1509 providing electrical communication with the emitter 1501. A spacer layer 1570 is arranged over the emitter 1601, with such spacer 1670 including, for example, a clear encapsulant or a gap. The spacer layer 1570 is overlaid with a first layer 1510 containing at least one first lumiphoric material, overlaid with a lower encapsulant layer 1540, overlaid with a second layer 1520 containing at least one second lumiphoric material, and overlaid with an upper encapsulant and/or lens material 1560. The first layer 1510 is spatially separated from the emitter 1501 by the intervening spacer layer 1570. Protruding portions 1511 extending outward from the first layer 1510 into the lower encapsulant layer 1540 and into the second layer 1520, providing an interface 1515B between the first layer 1510 and the second layer 1520, and providing another interface 1515A between the first layer 1510 and the lower encapsulant layer 1540. In this manner, lateral wall portions of the protrusions 1511 contact both the lower encapsulant layer 1540 and the second layer 1520. The lower encapsulant layer 1540 may include discontinuous portions arranged between the protrusions 1511 of the first layer 1510. An upper surface 1568 of the upper encapsulant and/or lens material 1560 may constitute a light emitting surface of the device 1500, or may be overlaid by one or more additional layers or structures (not shown).

FIG. 16 is a side cross-sectional schematic view of a lighting device 1600 that is similar to the device illustrated in FIG. 15, but with at least one lumiphor-containing material substituted for the lower encapsulant layer, and lacking an upper encapsulant layer. FIG. 16 illustrates a lighting device 1600 including an electrically activated emitter 1601 mounted over a floor 1651 of a reflector cup 1654 defined in a body structure 1650, with wirebonds 1608, 1609 providing electrical communication with the emitter 1601. A spacer layer 1670 is arranged over the emitter 1601, with such spacer 1670 including, for example, a clear encapsulant or a gap. The spacer layer 1670 is overlaid with a first layer 1610 containing at least one first lumiphoric material, overlaid with a second layer 1620 containing at least one second lumiphoric material, and overlaid with a third layer 1630 containing at least one third lumiphoric material. The first layer 1610 is spatially separated from the emitter 1601 by the intervening spacer layer 1670. Protruding portions 1611 of the first layer 1610 extend through the second layer 1620 into the third layer 1630, providing an interface 1615A between the first layer 1610 and the second layer 1620, and providing another interface 1615B between the first layer 1610 and the third encapsulant layer 1630. In this manner, lateral wall portions of the protrusions 1611 contact both the second layer 1620 and the third layer 1630. The second layer 1620 may include discontinuous portions arranged between the protrusions 1611 of the first layer 1610. The second layer 1620 may further include portions containing lumiphoric materials of different concentrations and/or different compositions, such as in discontinuous regions between the protrusions 1611. An upper surface 1648 of the third layer 1630 may constitute a light emitting surface of the device 1600, or may be overlaid by one or more additional layers or structures (not shown).

In certain embodiments, lighting devices may include multiple electrically activated emitters, such as shown in FIGS. 17-20, and may include one or more lenses (e.g., Fresnel lenses), such as shown in FIGS. 18-20.

FIG. 17 is a side cross-sectional schematic view of a lighting device 1700 including electrically activated emitters 1701A, 1701B mounted over a floor 1751 of a reflector cup 1754 defined in a body structure 1750, with wirebonds providing electrical communication with the emitters 1701A, 1701B. The emitters 1701A, 1701B are overlaid with a first layer 1710 containing at least one first lumiphoric material, overlaid with a second layer 1720 containing at least one second lumiphoric material (including different second layer regions 1720A, 1720B containing different amounts, concentrations and/or compositions of lumiphoric material), and overlaid with a third layer 1730 containing at least one third lumiphoric material. Textured interfaces 1715A, 1715B are provided between the first layer 1710 and the different regions 1720A, 1720B of the second layer 1720, including protrusions 1711A and recesses 1712A proximate to one second layer region 1720A, and including protrusions 1711B and recesses 1712B proximate to another second layer region 1720B. The different portions 1720A, 1720B of the second layer 1720 are segregated along a boundary 1719, with one portion 1720A of the second layer 1720 being arranged over one emitter 1701A, and another portion 1720B of the second layer 1720 being arranged over the other emitter 1701B. Use of laterally segregated portions 1720A, 1720B of the second layer 1720 containing different amounts, concentrations, and/or compositions of lumiphoric material enables portions 1720A, 1720B of the second layer having different stimulation and/or emission characteristics to be tailored to the emitters 1701A, 1701B. An upper surface 1738 of the third layer 1730 may constitute a light emitting surface of the device 1700, or may be overlaid by one or more additional layers or structures (not shown).

FIG. 18 is a side cross-sectional schematic view of a lighting device 1800 including electrically activated emitters 1801A, 1801B mounted over a floor 1851 of a reflector cup 1854 defined in a body structure 1850, with wirebonds providing electrical communication with the emitters 1801A, 1801B. The emitters 1801A, 1801B are overlaid with a first layer 1810 containing at least one first lumiphoric material, overlaid with a spacer layer 1840, overlaid with a second layer 1820 containing at least one second lumiphoric material, and overlaid with a third layer 1830 containing at least one third lumiphoric material. The spacer layer 1840 may include a gap or at least one encapsulant material. Textured interfaces 1815A, 1815B are provided between the first layer 1810 and the spacer layer 1840, and between the first layer 1810 and the second layer 1820, respectively. Protruding portions 1811 of the first layer 1810 extend through the spacer layer 1840 into the second layer 1820, such that the protrusions 1811 contact both the spacer layer 1840 and the second layer 1820. Another textured interface 1825 including protruding portions 1821 of the second layer 1830 extend into the third layer 1830 and are arranged as a converging Fresnel lens. An upper surface 1838 of the third layer 1830 may constitute a light emitting surface of the device 1800, or may be overlaid by one or more additional layers or structures (not shown).

FIG. 19 is a side cross-sectional schematic view of a lighting device 1900 including electrically activated emitters 1901A, 1901B mounted over a floor 1951 of a reflector cup 1954 defined in a body structure 1950, with wirebonds providing electrical communication with the emitters 1901A, 1901B. The emitters 1901A, 1901B are overlaid with a first layer 1910 containing at least one first lumiphoric material, overlaid with a spacer layer 1940, overlaid with a second layer 1920 containing at least one second lumiphoric material, and overlaid with an encapsulant and/or lens material 1960. The spacer layer 1940 may include a gap or at least one encapsulant material. A textured interface 1915 is provided between the first layer 1910 and the spacer layer 1940, including protruding portions 1911 of the first layer 1910 that extend into the spacer layer 1940 (without contacting the second layer 1920). Another textured interface 1925 including protruding portions 1921 of the second layer 1930 extend into the encapsulant and/or lens material 1960 and are arranged as a converging Fresnel lens. An upper surface 1968 of the encapsulant and/or lens material 1960 may constitute a light emitting surface of the device 1900, or may be overlaid by one or more additional layers or structures (not shown).

FIG. 20 is a side cross-sectional schematic view of a lighting device 2000 including lumiphor-containing layers with textured surfaces forming multiple serially arranged Fresnel lenses. The device 2000 includes electrically activated emitters 2001A, 2001B mounted over a floor 2051 of a reflector cup 2054 defined in a body structure 2050, with wirebonds providing electrical communication with the emitters 2001A, 2001B. The emitters 2001A, 2001B are overlaid with a first layer 2010 containing at least one first lumiphoric material, overlaid with a second layer 2020 containing at least one second lumiphoric material, and overlaid with an encapsulant and/or lens material 2040. A textured interface 2015 is provided between the first layer 2010 and the second layer 2020, including protruding portions 2011 of the first layer 2010 that extend into the second layer 2020 and that form a converging (first) Fresnel lens. Another textured interface 2025 including protruding portions 2021 of the second layer 2030 extend into the encapsulant and/or lens material 2060 and are arranged as a diverging (second) Fresnel lens. An upper surface 2048 of the encapsulant and/or lens material 2040 may constitute a light emitting surface of the device 2000, or may be overlaid by one or more additional layers or structures (not shown).

FIG. 21 is a top plan schematic view of a lighting device 2100 including an electrically activated emitter 2101 arranged over a substrate or other mounting structure 2109, with the emitter 2101 being overlaid with a first layer 2110 (encompassing regions 2110A, 2110B) containing at least one first lumiphoric material, and overlaid with a second layer 2120 (encompassing regions 2120A, 2120B, 2120C) containing at least one second lumiphoric material, wherein portions of the first and second layer are concentrically arranged. That is, a central portion 2120A of the second layer is arranged within a near-central portion 2110A of the first layer, with the remaining portions 2120B, 2110B, 2120C being sequentially arranged as concentric circles. Although only two lumiphor-containing layers 2110, 2120 are illustrated in FIG. 21, it is to be appreciated that more than two lumiphor-containing layers could be provided in alternative embodiments.

FIG. 22 is a chart including a comparison of luminous flux for a lighting device including an electrically activated emitter overlaid with a discrete yellow phosphor-containing layer that is further overlaid by a discrete red phosphor-containing layer (depicted at left in FIG. 22), relative to luminous flux for a traditional lighting device including a lumiphor layer including red and yellow phosphor materials dispersed therein (depicted at right in FIG. 22). The layered approach generated output 55 lumens greater than the traditional approach, representing a 5% gain in luminous flux.

Figure 23:
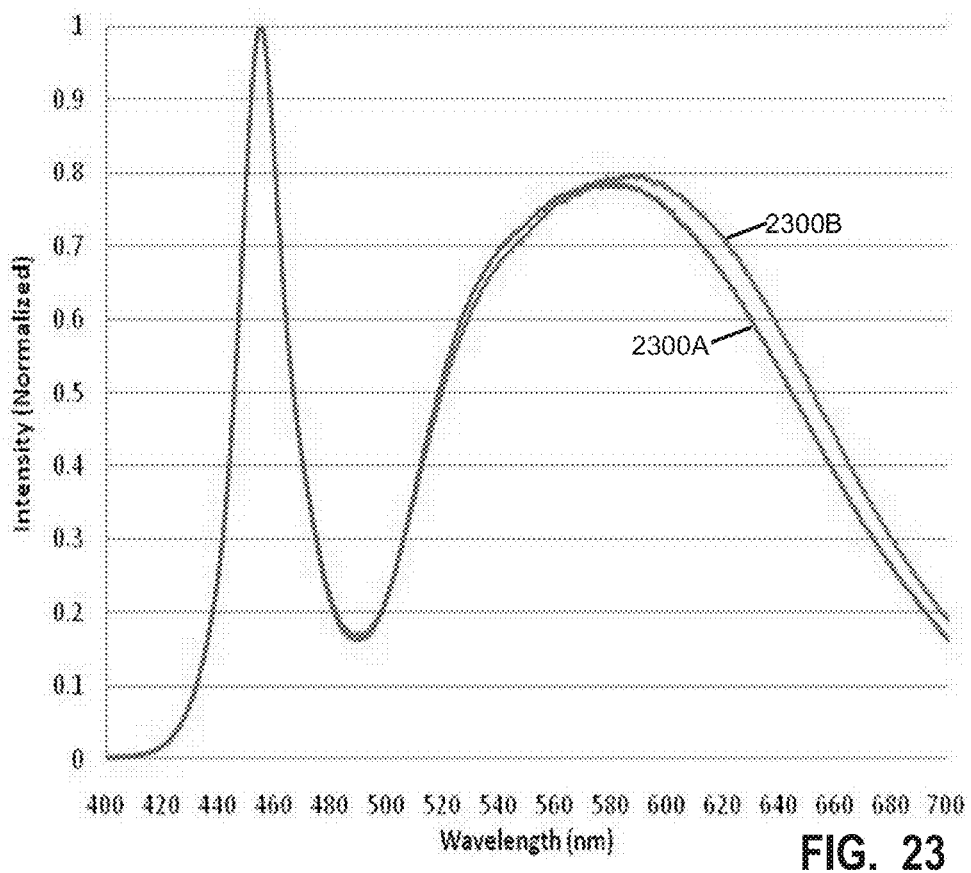
FIG. 23 is a line chart depicting luminous intensity (normalized) as a function of wavelength (nm) for a lighting device including an electrically activated emitter overlaid with a yellow phosphor-containing layer that is further overlaid by a red phosphor-containing layer, relative to luminous flux for a traditional lighting device including a lumiphor layer including red and yellow phosphor materials dispersed therein, at a correlated color temperature of 4000K.

FIG. 23 is a line chart depicting luminous intensity (normalized) as a function of wavelength (nm) for a lighting device 2300A including an electrically activated emitter overlaid with a discrete yellow phosphor-containing layer that is further overlaid by a discrete red phosphor-containing layer, relative to luminous flux for a traditional lighting device 2300B including a lumiphor layer including red and yellow phosphor materials dispersed therein, at a correlated color temperature of 4000K. The use of sequential yellow and then red phosphor layers provides more spectral power emphasis in 530-600 nm range (and less spectral power in the 600-700 nm range), which corresponds to greater luminous flux as illustrated in FIG. 22.

FIG. 24A is a chart including a comparison of Color Rendering Index (CRI) for a lighting device including an electrically activated emitter overlaid with a red phosphor-containing layer that is further overlaid by a yellow phosphor containing layer relative to CRI for a traditional lighting device including a lumiphor layer including red and yellow phosphor materials dispersed therein, at a correlated color temperature of 3000K. The use of a red phosphor layer overlaid by a yellow phosphor layer provides a gain of 4 points in Color Rendering Index (CRI).

FIG. 24B is a chart including a comparison of modified color rendering index (CRI-9) for a lighting device including an electrically activated emitter overlaid with a red phosphor-containing layer that is further overlaid by a yellow phosphor containing layer relative to CRI-9 for a traditional lighting device including a lumiphor layer including red and yellow phosphors dispersed therein, at a correlated color temperature of 3000K. The use of a red phosphor layer overlaid by a yellow phosphor layer provides a gain of over 20 points in CRI-9.

Figure 25:
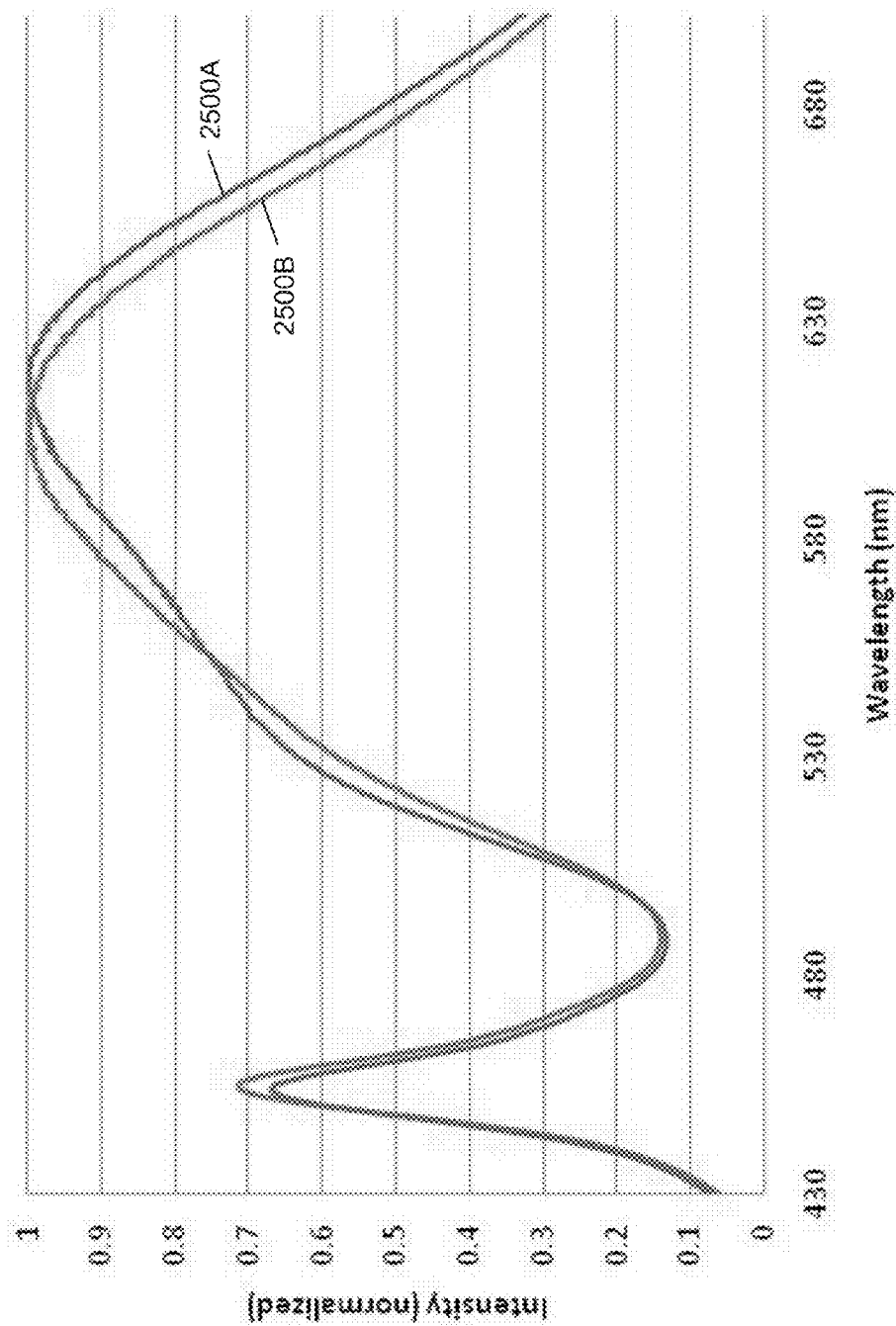
FIG. 25 is a line chart depicting luminous intensity (normalized) as a function of wavelength (nm) for a lighting device including a solid state emitter overlaid with a red phosphor-containing layer that is further overlaid by a yellow phosphor containing layer, both at a correlated color temperature of 3000K.

FIG. 25 is a line chart depicting luminous intensity (normalized) as a function of wavelength (nm) for a lighting device 2500A including a solid state emitter overlaid with a red phosphor-containing layer that is further overlaid by a yellow phosphor containing layer, relative to a traditional lighting device 2500B including a lumiphor layer including red and yellow phosphors dispersed therein, both at a correlated color temperature of 3000K. The red then yellow layered method has less reabsorption of the yellow emission in the 500-560 nm range and more overall spectral power in the wavelength range greater than 600 nm, resulting in a higher total CRI (as depicted in FIG. 24A) and better red rendering response (e.g., CRI-9) (as depicted in FIG. 24B).

FIGS. 22-25 demonstrate that different combinations of layered phosphor materials may be used to adjust color rendering index and/or luminous flux. Although such figures relate to use of only discrete red and yellow phosphor-containing layers, it is to be appreciated that combinations any number of lumiphors of any desirable peak wavelengths may be utilized in discrete lumiphor containing layers according to devices and methods as described herein.

Certain embodiments of the invention are directed to methods for illuminating an object, a space, or an environment, utilizing at least one lighting device as described herein.

Embodiments as disclosed herein may provide one or more of the following beneficial technical effects: enhanced adhesion between layers (e.g., lumiphoric material containing layers) of a lighting device; enhanced control of optical properties (including, but not limited, focus and/or directionality) of lighting devices including lumiphoric materials; enhanced light extraction from lighting device including lumiphoric materials; enhanced color mixing of a lighting device including lumiphoric material, thereby permitting a lighting device (e.g., LED lighting device) to be tailored to a selected end use.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Various combinations and sub-combinations of the structures described herein are contemplated and will be apparent to a skilled person having knowledge of this disclosure. Any of the various features and elements as disclosed herein may be combined with one or more other disclosed features and elements unless indicated to the contrary herein. Correspondingly, the invention as hereinafter claimed is intended to be broadly construed and interpreted, as including all such variations, modifications and alternative embodiments, within its scope and including equivalents of the claims.

What is claimed is:

1. A lighting device comprising:
   at least one electrically activated emitter;
   a first layer comprising at least one first lumiphoric material overlying at least a portion of the at least one electrically activated emitter and arranged to be stimulated by emissions of the at least one electrically activated emitter; and
   a second layer comprising at least one second lumiphoric material overlying at least a portion of the first layer and arranged to be stimulated by emissions of the at least one electrically activated emitter;
   wherein an interface between the first layer and the second layer is textured, and the textured interface comprises at least one of the following textural features (i) and (ii):
   (i) at least one outwardly protruding portion of the first layer that includes at least one protruding portion lateral wall of the first layer arranged in contact with the second layer, wherein the at least one protruding portion of the first layer comprises a height of at least 5 micrometers; and
   (ii) at least one recess defined in the first layer that is bounded by at least one recess lateral wall of the first layer arranged in contact with the second layer, wherein the at least one recess defined in the first layer comprises a depth of at least 5 micrometers; and
   wherein the textural features comprise at least one of the following cross-sectional conformations: sawtooth, interrupted sawtooth, truncated sawtooth, square wave, interrupted square wave, square-shaped, rectangular, trapezoidal, triangular, and truncated triangular.

2. A lighting device according to claim 1, wherein the textured interface between the first layer and the second layer comprises feature (i).

3. A lighting device according to claim 1, wherein the textured interface between the first layer and the second layer comprises feature (ii).

4. A lighting device according to claim 3, wherein the at least one recess does not penetrate through an entire thickness of the first layer.

5. A lighting device according to claim 1, wherein the textured interface between the first layer and the second layer comprises a plurality of outwardly protruding portions of the first layer each having a height of at least 5 micrometers or comprises a plurality of recesses defined in the first layer with each recess of the plurality of recesses in the first layer comprising a depth of at least 5 micrometers.

6. A lighting device according to claim 1 comprising at least three outwardly protruding portions of the first layer or comprising at least three recesses defined in the first layer, wherein gaps between adjacent outwardly protruding portions of the at least three outwardly protruding portions, or gaps between adjacent recesses of the at least three recesses, are substantially equal in length.

7. A lighting device according to claim 1, wherein the textured interface between the first layer and the second layer comprises multiple outwardly protruding portions of the first layer having heights that differ relative to one another, or comprises multiple recesses defined in the first layer having depths that differ relative to one another.

8. A lighting device according to claim 1, wherein the textured interface between the first layer and the second layer is arranged as any of a collimating lens, a focusing lens, a diverging lens, and a Fresnel lens.

9. A lighting device according to claim 1, wherein the at least one second lumiphoric material is compositionally different from the at least one first lumiphoric material.

10. A lighting device according to claim 1, wherein the first layer comprises a first binder material, and the second layer comprises a second binder material that is compositionally different from the first binder material.

11. A lighting device according to claim 1, wherein the first layer comprises a material having first index of refraction, and the second layer comprises a material having second index of refraction that is less than the first index of refraction.

12. A lighting device according to claim 1, wherein at least one of the first layer and the second layer comprises at least one light scattering material, and wherein at least one of presence, concentration, amount, average particle size, and distribution of the at least one light scattering material differs between the first layer and the second layer.

13. A lighting device according to claim 1, wherein the first layer is arranged in contact with the at least one electrically activated emitter.

14. A lighting device according to claim 1, wherein the first layer is spatially segregated from the at least one electrically activated emitter.

15. A lighting device according to claim 1, further comprising a spacer layer disposed between at least a portion of the first layer and the second layer.

16. A lighting device according to claim 15, wherein the spacer layer is devoid of any lumiphoric material.

17. A lighting device according to claim 1, further comprising at least one lateral bounding element contacting an edge portion of at least one of the first layer and the second layer.

18. A lighting device according to claim 1, wherein the at least one electrically activated emitter comprises at least one electrically activated solid state emitter.

19. A lighting device according to claim 18, wherein the at least one electrically activated solid state emitter is arranged within a reflector cup contacting an edge portion of at least one of the first layer and the second layer.

20. A lighting device according to claim 1, wherein the at least one first lumiphoric material comprises a first peak wavelength, the at least one second lumiphoric material comprises a second peak wavelength, and the second peak wavelength is at least about 50 nm greater than the first peak wavelength.

21. A lighting device according to claim 1, wherein the at least one first lumiphoric material is adapted to emit any of yellow, red, and green light; and wherein the at least one second lumiphoric material is adapted to emit any of yellow, red, and green light.

22. A lighting device according to claim 1, wherein the first layer overlies an entirety of the at least one electrically activated emitter.

23. A lighting device according to claim 1, wherein the second layer is continuous in character and is devoid of unconnected segments.

24. A lighting device according to claim 1, wherein the second layer overlies less than an entirety of the first layer.

25. A lighting device according to claim 1, comprising at least one protruding portion lateral wall that is angled in a direction that is non-perpendicular to a light emitting surface of the at least one electrically activated emitter, or comprising at least one recess lateral wall is angled in a direction that is non-perpendicular to the light emitting surface of the at least one electrically activated emitter.

26. A lighting device according to claim 1, wherein the at least one first lumiphoric material is substantially uniformly dispersed in the first layer, and the at least one second lumiphoric material is substantially uniformly dispersed in the second layer.

27. A lighting device according to claim 1, wherein the textured interface between the first layer and the second layer comprises at least one of the following textural features (A) and (B):
   (A) a plurality of outwardly protruding portions of the first layer that are arranged in an array or are concentrically arranged, wherein each outwardly protruding portion includes at least one protruding portion lateral wall of the first layer arranged in contact with the second layer, and wherein each protruding portion of the first layer comprises a height of at least 5 micrometers; and
   (B) a plurality of recesses defined in the first layer and that are arranged in an array or are concentrically arranged, wherein each recess is bounded by at least one recess lateral wall of the first layer arranged in contact with the second layer, and wherein the at least one recess defined in the first layer comprises a depth of at least 5 micrometers.

28. A lighting device according to claim 1, wherein the textured interface between the first layer and the second layer comprises at least one of the following textural features (a) and (b):
   (a) at least one outwardly protruding portion of the first layer that includes at least one protruding portion lateral wall of the first layer arranged in contact with the second layer, wherein the at least one protruding portion of the first layer comprises a height of at least 10 micrometers; and
   (b) at least one recess defined in the first layer that is bounded by at least one recess lateral wall of the first layer arranged in contact with the second layer, wherein the at least one recess defined in the first layer comprises a depth of at least 10 micrometers.

29. A lighting device according to claim 1, further comprising a third layer overlying at least a portion of the second layer, wherein an interface between the second layer and the third layer comprises at least one of the following features (c) and (d):
   (c) at least one outwardly protruding portion of the second layer that includes at least one protruding portion lateral wall of the second layer arranged in contact with the third layer, wherein the at least one protruding portion of the second layer comprises a height of at least 5 micrometers; and (d) at least one recess defined in the second layer that is bounded by at least one recess lateral wall of the second layer arranged in contact with the third layer, wherein the at least one recess defined in the second layer comprises a depth of at least 5 micrometers.

30. A lighting device according to claim 29, wherein the third layer comprises at least one third lumiphoric material that is compositionally different from the at least one first lumiphoric material and the at least one second lumiphoric material.

31. A lighting device according to claim 29, wherein the third layer is devoid of any lumiphoric material.

32. A lighting device according to claim 29, wherein the interface between the second layer and the third layer is arranged as any of a collimating lens, a focusing lens, a diverging lens, and a Fresnel lens.

33. A lighting device according to claim 1, wherein the first layer covers an entire upper surface of the at least one electrically activated emitter.

34. A lighting device comprising:
at least one electrically activated emitter;
a first layer comprising at least one first lumiphoric material overlying at least a portion of the at least one electrically activated emitter and arranged to be stimulated by emissions of the at least one electrically activated emitter; and
a second layer comprising at least one second lumiphoric material overlying at least a portion of the first layer and arranged to be stimulated by emissions of the at least one electrically activated emitter; and
a third layer overlying at least a portion of the second layer, wherein an interface between the first layer and the second layer comprises at least one of the following features (i) and (ii):
  (i) at least one outwardly protruding portion of the first layer that includes at least one protruding portion lateral wall of the first layer arranged in contact with the second layer, wherein the at least one protruding portion of the first layer comprises a height of at least 5 micrometers; and
  (ii) at least one recess defined in the first layer that is bounded by at least one recess lateral wall of the first layer arranged in contact with the second layer, wherein the at least one recess defined in the first layer comprises a depth of at least 5 micrometers; and
wherein an interface between the second layer and the third layer comprises at least one of the following features (iii) and (iv):
  (iii) at least one outwardly protruding portion of the second layer that includes at least one protruding portion lateral wall of the second layer arranged in contact with the third layer, wherein the at least one protruding portion of the second layer comprises a height of at least 5 micrometers; and
  (iv) at least one recess defined in the second layer that is bounded by at least one recess lateral wall of the second layer arranged in contact with the third layer, wherein the at least one recess defined in the second layer comprises a depth of at least 5 micrometers.

35. A lighting device according to claim 34, wherein the third layer comprises at least one third lumiphoric material that is compositionally different from the at least one first lumiphoric material and the at least one second lumiphoric material.

36. A lighting device according to claim 34, wherein the third layer is devoid of any lumiphoric material.

37. A lighting device according to claim 34, wherein the interface between the second layer and the third layer is arranged as any of a collimating lens, a focusing lens, a diverging lens, and a Fresnel lens.

38. A lighting device comprising:
at least one electrically activated emitter;
a first layer comprising at least one first lumiphoric material arranged to receive light generated by the at least one electrically activated emitter;
a second layer comprising at least one second lumiphoric material overlying the first layer and arranged to receive emissions from the first layer;
an additional layer overlying the second layer and arranged to receive emissions from the second layer;
wherein at least one surface of at least one of the first layer and the second layer is textured and comprises at least one of the following items (i) and (ii):
  (i) at least three textural features that are regularly spaced relative to one another with substantially equal gaps between adjacent textural features, wherein the at least three textural features that are regularly spaced include at least one of recesses and outwardly protruding portions; and
  (ii) at least three textural features comprising regularized height or depth that include at least one of recesses and outwardly protruding portions, including variation in height or depth of less than 20% among the at least three textural features comprising regularized height or depth.

39. A lighting device according to claim 38, wherein the first layer is arranged in contact with the second layer.

40. A lighting device according to claim 38, wherein the second layer is arranged in contact with the additional layer.

41. A lighting device according to claim 38, wherein the first layer is spatially segregated from the at least one electrically activated emitter.

42. A lighting device according to claim 38, wherein the additional layer comprises at least one third lumiphoric material.

43. A lighting device according to claim 38, wherein the at least one surface of at least one of the first layer and the second layer comprises item (i).

44. A lighting device according to claim 38, wherein the at least one surface of at least one of the first layer and the second layer comprises item (ii).

45. A lighting device according to claim 38, wherein at least one surface of at least one of the first layer and the second layer comprises any of a collimating lens, a focusing lens, a diverging lens, and a Fresnel lens.

46. A lighting device according to claim 38, wherein each recess does not penetrate through an entire thickness of the first layer.

47. A lighting device according to claim 38, wherein the first layer covers an entire upper surface of the at least one electrically activated emitter.

* * * * *